(12) United States Patent
Sato et al.

(10) Patent No.: US 7,440,104 B2
(45) Date of Patent: Oct. 21, 2008

(54) EXPOSURE SYSTEM, TEST MASK FOR MONITORING POLARIZATION, AND METHOD FOR MONITORING POLARIZATION

(75) Inventors: Takashi Sato, Fujisawa (JP); Kazuya Fukuhara, Tokyo (JP); Keita Asanuma, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 341 days.

(21) Appl. No.: 11/267,103

(22) Filed: Nov. 7, 2005

(65) Prior Publication Data
US 2006/0098183 A1 May 11, 2006

(30) Foreign Application Priority Data
Nov. 10, 2004 (JP) .......................... P2004-326795

(51) Int. Cl.
*G01J 4/00* (2006.01)
(52) U.S. Cl. ...................................... 356/369; 356/364
(58) Field of Classification Search ......... 356/364–369, 356/237.1–237.4; 250/559.39
See application file for complete search history.

(56) References Cited

U.S. PATENT DOCUMENTS 5,636,004 A * 6/1997 Ootaka et al. ................. 355/67
2004/0137338 A1 7/2004 Inao et al.

FOREIGN PATENT DOCUMENTS

| JP | 11-087232 | 3/1999 |
| JP | 11-233434 | 8/1999 |
| JP | 2000-310850 | 11/2000 |

* cited by examiner

*Primary Examiner*—Tarifur R Chowdhury
*Assistant Examiner*—Tara S Pajoohi
(74) *Attorney, Agent, or Firm*—Finnegan, Henderson, Farabow, Garrett & Dunner, L.L.P.

(57) ABSTRACT

An exposure system includes an exposure tool configured to project grating patterns oriented in different directions onto test areas by a linearly polarized light, respectively, each of the grating patterns having a space width preventing higher order diffracted lights from an image formation, a data collector configured to collect sets of test optical intensity data on the test areas, and a polarization direction monitor configured to monitor a polarization direction of the linearly polarized light by comparing the sets of the test optical intensity data.

18 Claims, 18 Drawing Sheets

EXPOSURE SYSTEM, TEST MASK FOR MONITORING POLARIZATION, AND METHOD FOR MONITORING POLARIZATION

CROSS REFERENCE TO RELATED APPLICATIONS AND INCORPORATION BY REFERENCE

This application is based upon and claims the benefit of priority from prior Japanese Patent Application P2004-326795 filed on Nov. 10, 2004; the entire contents of which are incorporated by reference herein.

BACKGROUND OF THE INVENTION

1. Field of the Invention

The present invention relates to photolithographic projection and in particular to an exposure system, a test mask for monitoring polarization, and a method for monitoring the polarization.

2. Description of the Related Art

When a semiconductor device is manufactured with a lithographic process, it is important to optimize lithographic conditions, such as the polarization direction of light, dose, and the focus point for each of a plurality of masks. Resolution limit "R", and depth-of-focus (DOF) of an optical system in an exposure system are given by following equations (1) and (2):

$$R = k_1 \lambda / NA \quad (1)$$

$$DOF = k_2 \lambda / NA^2 \quad (2)$$

where "λ" is the wavelength of the light, "NA" is a numerical aperture of the optical system, and "$k_1$" and "$k_2$" are k-factors representing lithographic process other than the wavelength "λ" or the NA, such as resist properties. "$k_1$" has a typical value of 0.61, and "$k_2$" has a typical value of 0.5. As shown in the equation (1), a shorter wavelength "λ" and a larger NA permit smaller features to be printed. However, as shown in the equation (2), the wavelength "λ" and the NA are limited by the DOF requirement. Therefore, it is crucial to control the polarization direction, the dose, and the focus point to improve image fidelity under a shallow DOF. In Japanese Patent Laid-Open Publication No. 2000-310850, a method for monitoring the dose is proposed. According to the method, a periodic pattern having a pitch smaller than the resolution limit "R" is projected. Then, a line width of a projected image of the periodic pattern is observed to monitor the dose.

SUMMARY OF THE INVENTION

An aspect of present invention inheres in an exposure system according to an embodiment of the present invention. The system includes an exposure tool configured to project a plurality of grating patterns oriented in different directions onto a plurality of test areas by a linearly polarized light, respectively. Each of the plurality of grating patterns has a space width preventing higher order diffracted lights from an image formation. Also, the system includes a data collector configured to collect a plurality of sets of test optical intensity data on the plurality of test areas, respectively, and a polarization direction monitor configured to monitor a polarization direction of the linearly polarized light by comparing the plurality of sets of the test optical intensity data.

Another aspect of the present invention inheres in a test mask for monitoring polarization according to the embodiment of the present invention. The test mask includes a mask substrate, and a plurality of grating patterns oriented in different directions on the mask substrate. Each of the plurality of grating patterns has a space width preventing higher order diffracted lights from an image formation in an optical system of an exposure system.

Yet another aspect of the present invention inheres in a method for monitoring polarization according to the embodiment of the present invention. The method includes projecting a plurality of grating patterns oriented in different directions onto a plurality of test areas by a linearly polarized light, respectively. Each of the plurality of grating patterns has a space width preventing higher order diffracted lights from an image formation. The method further includes collecting a plurality of sets of test optical intensity data on the plurality of test areas, respectively, and monitoring a polarization direction of the linearly polarized light by comparing the plurality of sets of the test optical intensity data.

DETAILED DESCRIPTION OF THE INVENTION

Figure 1:
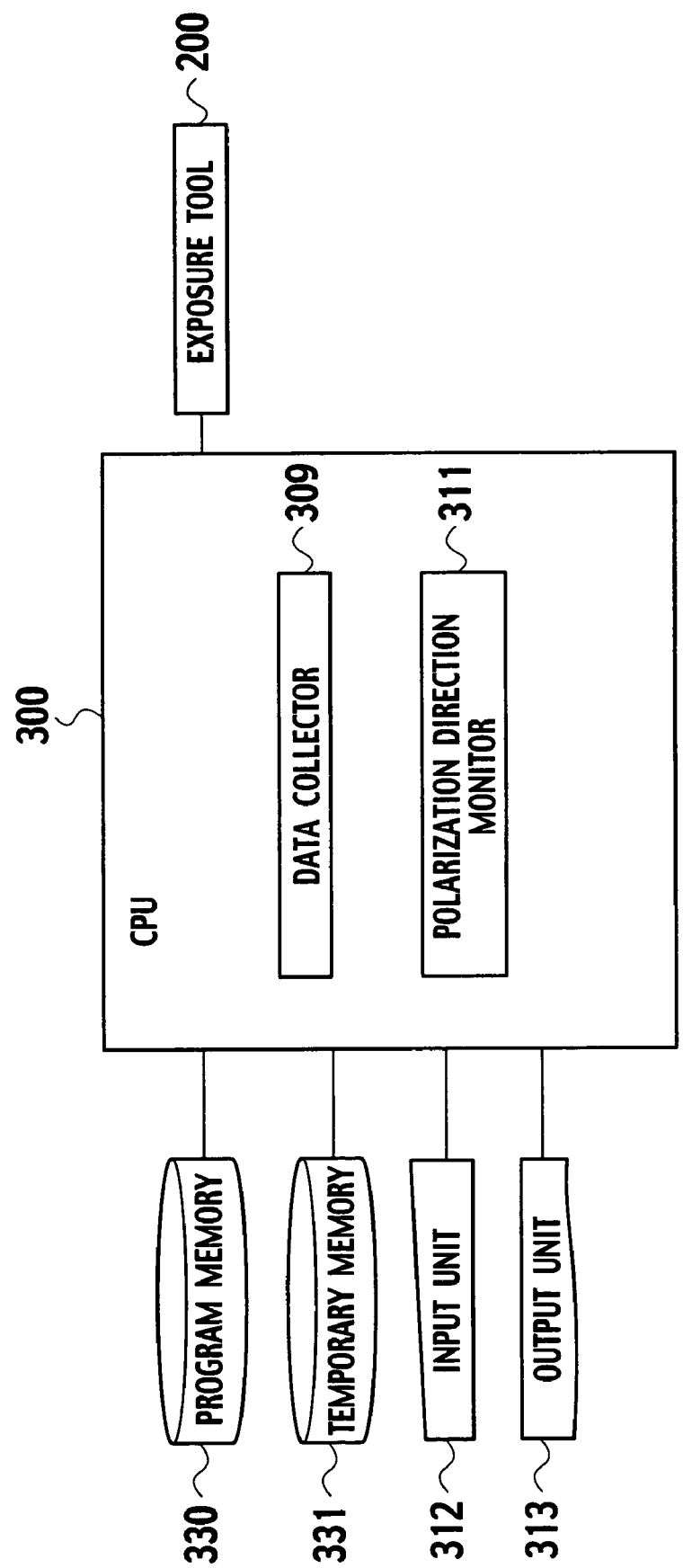
FIG. 1 is a diagram of an exposure system in accordance with a first embodiment of the present invention.

Embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

An exposure system according to the first embodiment includes an exposure tool 200 and a central processing unit (CPU) 300. The exposure tool 200 is configured to project a plurality of grating patterns onto a plurality of test areas by a linearly polarized light, respectively. Each of the plurality of grating patterns has a space width preventing higher order diffracted lights from image formation. The plurality of grating patterns are oriented in different directions, respectively. The CPU 300 includes a data collector 309 and a polarization direction monitor 311. The data collector 309 is configured to collect a plurality of sets of test optical intensity data on the plurality of test areas. The polarization direction monitor 311 is configured to monitor a polarization direction of the linearly polarized light by comparing the plurality of sets of the test optical intensity data.

Figure 2:
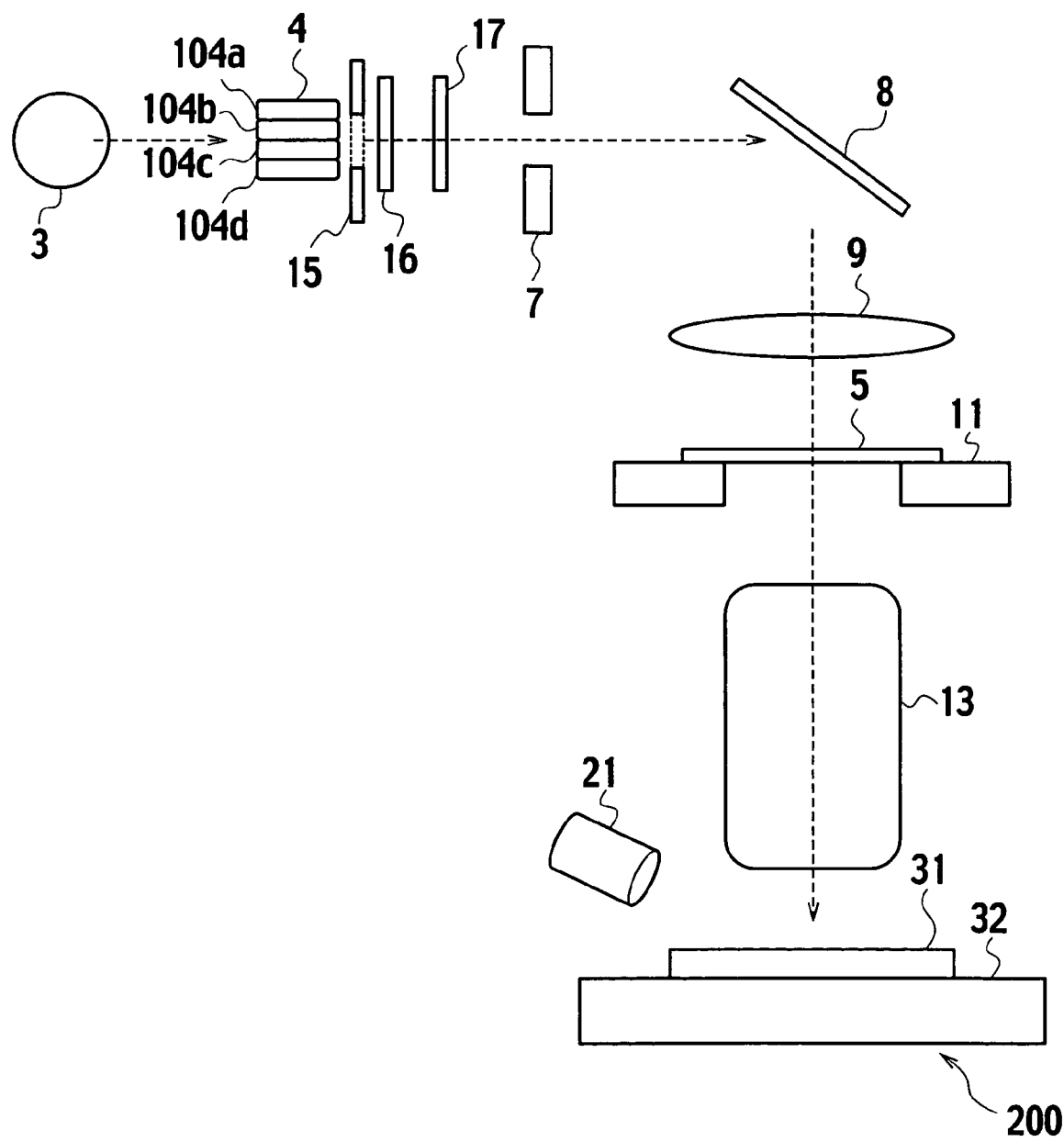
FIG. 2 illustrates an exposure tool in accordance with the first embodiment of the present invention.

With reference next to FIG. 2, the exposure tool 200 includes a light source 3 emitting the light such as ArF (argon fluoride) laser. ArF laser has a wavelength of 193 nm. A light integrator 4 disposed opposite the light source 3 provides a uniform illumination. An aperture 15 disposed opposite the light integrator 4 changes an effective diameter of the light and controls a dose of the light. A polarizer holder 16 disposed opposite the light integrator 4 is configured to hold a polarizer. The light passing through the polarizer forms a linearly polarized light. A wave plate holder 17 disposed opposite the polarizer holder 16 is configured to hold a quarter wave plate, if necessary. The linearly polarized light passing through the quarter wave plate forms a circularly polarized light. A reticle blind 7 opposite the wave plate holder 17 defines an illuminated field on a test mask for monitoring the polarization disposed on a reticle stage 11 in the exposure tool 200. A reflection mirror 8 in the exposure tool 200 reflects the polarized light passing through the reticle blind 7. A condenser lens 9 in the exposure tool 200 condenses the polarized light reflected from the reflection mirror 8. The reticle stage 11 is disposed beneath the condenser lens 9. A projection lens 13 is disposed beneath the reticle stage 11 and a wafer stage 32 is disposed beneath the projection lens 13.

The light irradiated from the light source 3 penetrates each of a plurality of lens elements 104a, 104b, 104c and 104d which form the light integrator 4. The light passing through each of the plurality of lens elements 104a-104d is irradiated onto an entire surface of the illuminated field on the test mask 5 for monitoring the polarization placed on the reticle stage 11 through the polarizer held by the polarizer holder 6, the reflection mirror 8 and the condenser lens 9. Hence, on the test mask 5 for monitoring the polarization, the polarized lights passing through the plurality of lens elements 104a-104d of the light integrator 4 are superimposed on the others. Therefore, an even illumination is provided on the test mask 5 for monitoring the polarization. A wafer 31 is disposed on the wafer stage 32. The polarized light passing through the test mask 5 for monitoring the polarization is condensed by the projection lens 13 and reaches a surface of the wafer 31. Further, the exposure tool 200 is equipped with a camera 21. The camera 21 detects the optical intensity "I" of the polarized light irradiated on the surface of the wafer 31. The charge coupled device (CCD) camera can be used for the camera 21. By a charge to voltage conversion, the camera 21 converts the optical intensity to the voltage.

Figure 3:
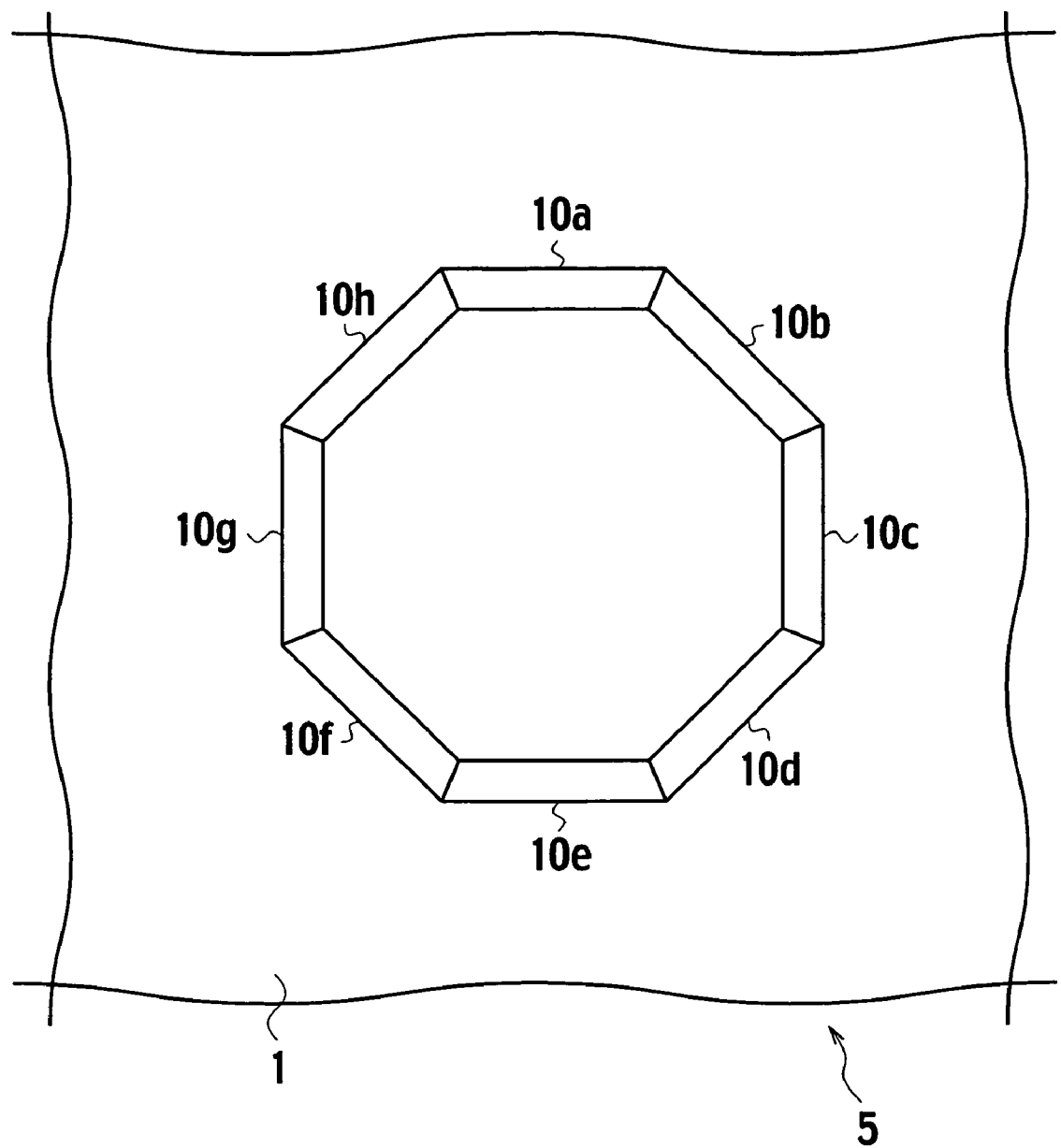
FIG. 3 is a plan view of a test mask for monitoring polarization in accordance with the first embodiment of the present invention.

With reference to FIG. 3, the test mask 5 for monitoring the polarization according to the first embodiment includes a transparent mask substrate 1 and a plurality of grating patterns 10a, 10b, 10c, 10d, 10e, 10f, 10g, and 10h disposed on the mask substrate 1. The mask substrate 1 is composed of a quartz glass, for example. The plurality of grating patterns 10a, 10b, 10c, 10d, 10e, 10f, 10g, and 10h are oriented in different directions, respectively.

An angle between longer directions of the grating patterns 10a and 10b is 135 degrees. An angle between longer directions of the grating patterns 10a and 10c is 90 degrees. An angle between longer directions of the grating patterns 10a and 10d is 45 degrees. Also, an angle between longer directions of the grating patterns 10a and 10h is 45 degrees. An angle between longer directions of the grating patterns 10a and 10g is 90 degrees. An angle between longer directions of the grating patterns 10a and 10f is 135 degrees. Further, longer directions of the grating patterns 10a and 10e are parallel.

Figure 4:
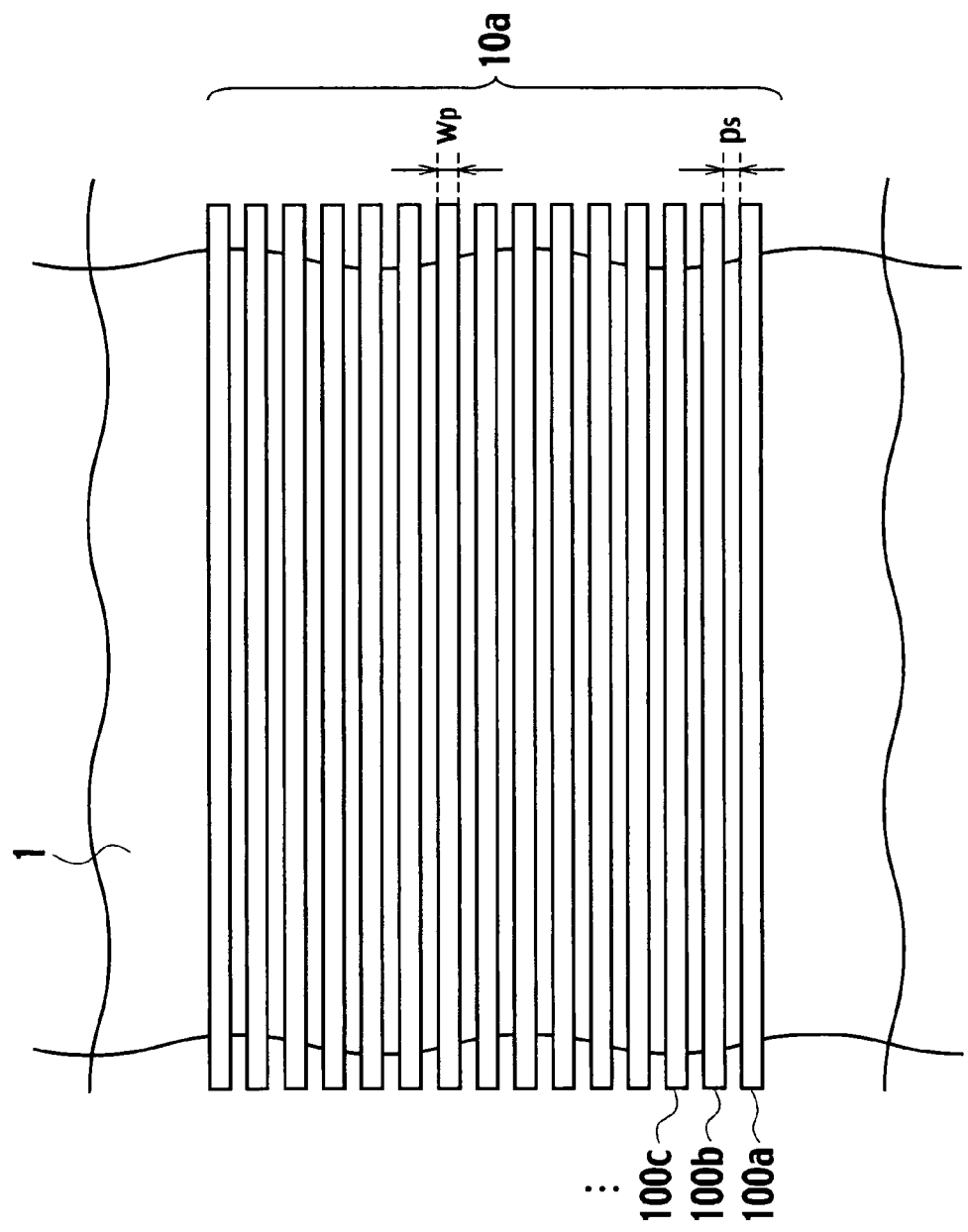
FIG. 4 is an enlarged plan view of a grating pattern in accordance with the first embodiment of the present invention.

FIG. 4 shows an enlarged plan view of the grating pattern 10a. The grating pattern 10a includes a plurality of parallel shield patterns 100a, 100b, and 100c disposed on the mask substrate 1. The plurality of shield patterns 100a, 100b, and 100c form a line grating. Each of the plurality of shield patterns 100a-100c is composed of chrome (Cr), for example. Also, each of the plurality of shield patterns 100a-100c has a line width "Wp" and a layer thickness of 100 nm. Further, the plurality of shield patterns 100a-100c are spaced apart at the space width "$p_s$". The space width "$p_s$" is given by an equation (3):

$$p_s < \lambda / \{M^*(NA^*(1+\sigma))\} \quad (3)$$

where "λ" is the wavelength of the light emitted from the light source 3 shown in FIG. 2. "M" is a magnification of the projection lens 13. "NA" is a numerical aperture of the projection lens 13. "σ" is a coherence factor.

Figure 5:
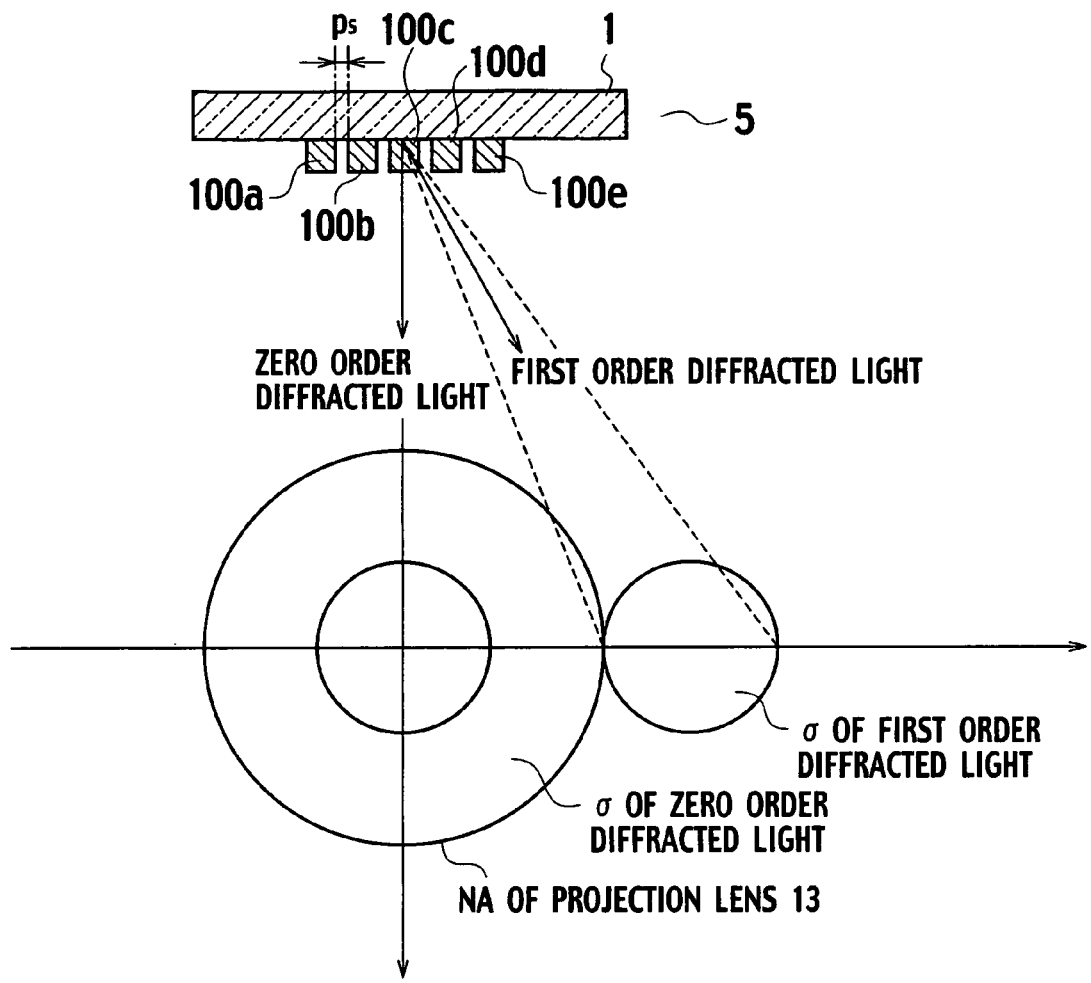
FIG. 5 is a diagram showing an optical system in accordance with the first embodiment of the present invention.

When the space width "$p_s$" satisfies the equation (3), as shown in FIG. 5, a first order diffracted light generated by the plurality of shield patterns 100a-100c is diffracted at angle larger than the NA of the projection lens 13. Accordingly, the first order diffracted light can not penetrate the projection lens 13 in the exposure tool 200. Higher order diffracted lights other than a zero order diffracted light are also diffracted at angles larger than the NA of the projection lens 13. Therefore, the zero order diffracted light passing through the test mask 5 for monitoring the polarization only penetrates the projection lens 13 shown in FIG. 2 and reaches the surface of the wafer 31 on the wafer stage 32.

For example, when the wavelength "$\lambda$" of the light is 193 nm, the magnification "M" of the projection lens 13 is ¼, the "NA" is 0.75, the coherence factor "$\sigma$" is 0.52, and the space width "$p_s$" shown in FIG. 4 is shorter than 677.2 nm, the zero order diffracted light passing through the test mask 5 for monitoring the polarization only penetrate the projection lens 13. Thus, when the space width "$p_s$" satisfies the equation (3), the higher order diffracted lights do not reach the surface of the wafer 31. Therefore, even if the surface of the wafer 31 is deviated from a focus point of the projection lens 13, the optical intensity "I" of the linearly polarized light reaching any portion of the surface of the wafer 31 remains substantially constant.

The plurality of grating patterns 10b-10h shown in FIG. 3 also includes the shield patterns spaced apart at the space width "$p_s$" satisfying the equation (3). Each enlarged plan view of the plurality of grating patterns 10b-10h is similar to FIG. 4. By using the test mask 5 for monitoring the polarization shown in FIG. 3, it is possible to monitor the polarization direction of the linearly polarized light passing through the polarizer held in the polarizer holder 16. In the following description, a reason it is possible to monitor the polarization direction of the linearly polarized light by using the test mask 5 for monitoring the polarization will be described.

Figure 6:
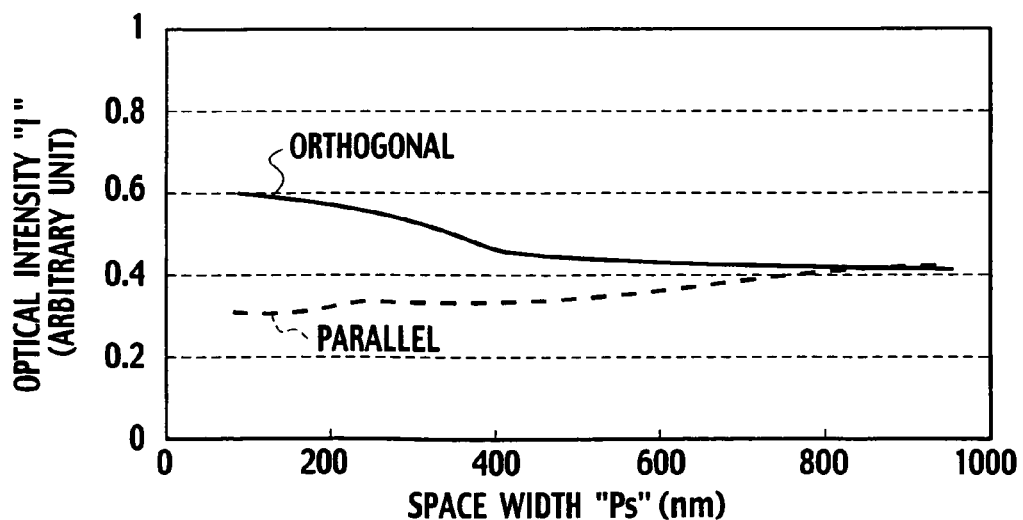
FIG. 6 is a graph showing optical intensity versus space width of the grating pattern in accordance with the first embodiment of the present invention.

FIG. 6 is a graph showing a relationship between the optical intensity "I" of the test area where the grating pattern 10a is projected on the wafer 31 shown in FIG. 2 and the space width "$p_s$" of the grating pattern 10a shown in FIGS. 3 and 4. When the space width "$p_s$" is shorter than about 800 nm that is four times as long as the wavelength (193 nm) of the linearly polarized light, the optical intensity "I" varies depending on the polarization direction that is a direction of an electric field vector of the light. The optical intensity "I" in the case where the polarization direction is orthogonal to the longer direction of the grating pattern 10a is different from the optical intensity "I" in the case where the polarization direction is parallel to the longer direction of the grating pattern 10a. Especially, when the space width "$p_s$" is shorter than about 400 nm that is twice as long as the wavelength "$\lambda$", the light intensities "I" varies conspicuously depending on the polarization direction. When the plurality of grating patterns 10b-10h are projected onto the plurality of test areas on the wafer 31, respectively, such phenomenon are also observed.

As described above, a transmittance of the linearly polarized light in the test mask 5 varies depending on the polarization direction relative to each longer direction of the plurality of grating patterns 10a-10h. Therefore, by disposing the test mask 5 for monitoring the polarization shown in FIG. 3 in the exposure tool 200 shown in FIG. 2 and comparing the light intensities "I" on the test areas where the grating patterns 10a-10h are projected, respectively, it is possible to monitor the polarization direction of the linearly polarized light passing through the polarizer held in the polarizer holder 16.

It should be noted that a difference between a vertical position of the surface of the wafer 31 and the focus point of the projection lens 13 does not affect the optical intensity "I" of the linearly polarized light reaching any portion of the surface of the wafer 31 when each space width "$p_s$" in the shield patterns 100a-100c satisfies the equation (3), as described above. Therefore, even though the projection lens 13 in the exposure tool 200 has astigmatism, the optical intensity "I" does not vary depending on each position of the grating patterns 10a-10h on the mask substrate 1 shown in FIG. 3

The data collector 309 shown in FIG. 1 collects the optical intensity "I" of the test area where the grating pattern 10a shown in FIG. 3 is projected on the wafer 31 shown in FIG. 2. Here, the optical intensity "I" is detected by the camera 21 shown in FIG. 2 and transferred to the data collector 309. Further, the data collector 309 defines the optical intensity "I" as a first test optical intensity datum "$I_1$". Further, the data collector 309 collects the optical intensity "I" on the test area where the grating pattern 10b is projected as a second test optical intensity datum "$I_2$", the optical intensity "I" on the test area where the grating pattern 10c is projected as a third test optical intensity datum "$I_3$", and the optical intensity "I" on the test area where the grating pattern 10d is projected as a fourth test optical intensity datum "$I_4$". Also, the data collector 309 collects the optical intensity "I" on the test area where the grating pattern 10e is projected as a fifth test optical intensity datum "$I_5$", the optical intensity "I" on the test area where the grating pattern 10f is projected as a sixth test optical intensity datum "$I_6$", the optical intensity "I" on the test area where the grating pattern 10g is projected as a seventh test optical intensity datum "$I_7$", and the optical intensity "I" on the test area where the grating pattern 10h is projected as an eighth test optical intensity datum "$I_8$".

The polarization direction monitor 311 shown in FIG. 1 compares the first test optical intensity datum "$I_1$", the second test optical intensity datum "$I_2$", the third test optical intensity datum "$I_3$", the fourth test optical intensity datum "$I_4$", the fifth test optical intensity datum "$I_5$", the sixth test optical intensity datum "$I_6$", the seventh test optical intensity datum "$I_7$", and the eighth test optical intensity datum "$I_8$" to monitor the polarization direction of the linearly polarized light irradiated on the test mask 5 for monitoring the polarization disposed in the exposure tool 200 shown in FIG. 2.

For example, when the polarization direction of the linearly polarized light is orthogonal to the longer directions of the grating patterns 10a, 10e, both of the first test optical intensity datum "$I_1$" and the fifth test optical intensity datum "$I_5$" are the highest value among the first to eighth test optical intensity data "$I_1$"-"$I_8$". In this case, the second test optical intensity datum "$I_2$", the fourth test optical intensity datum "$I_4$", the sixth test optical intensity datum "$I_6$", and the eighth test optical intensity datum "$I_8$" have substantially equal values. Therefore, the polarization direction monitor 311 shown in FIG. 1 chooses one of the test areas providing the highest value among the first to eighth test optical intensity data "$I_1$"-"$I_8$". Also, the polarization direction monitor 311 determines that the polarization direction of the linearly polarized light is orthogonal to the longer directions of one of the grating patterns 10a-10h corresponding to the chosen one of the test areas.

Also, for example, when both values of the first test optical intensity datum "$I_1$" and the fifth test optical intensity datum "$I_5$" are larger than others and both values of the fourth test optical intensity datum "$I_4$" and the eighth test optical intensity datum "$I_8$" are larger than both values of the second test optical intensity datum "$I_2$" and the sixth test optical intensity datum "$I_6$", the polarization direction of the linearly polarized light is inclined to the longer direction of the grating pattern 10b from the longer direction of the grating pattern 10c. In this case, the polarization direction monitor 311 shown in FIG. 1 compares the values of the second test optical intensity datum "$I_2$" and the eighth test optical intensity datum "$I_8$" or compares the values of the fourth test optical intensity datum "$I_4$" and the sixth test optical intensity datum "$I_6$" to determine the polarization direction of the linearly polarized light.

An input unit 312, an output unit 313, a program memory 330, and a temporary memory 331 are also connected to the CPU 300. A keyboard and a mouse may be used for the input unit 312. A printer and display devices such as a liquid crystal display (LCD) and a cathode ray tube (CRT) display can be used for the output unit 313, for example. The program memory 330 stores a program instructing the CPU 300 to transfer data with apparatuses connected to the CPU 300. The temporary memory 331 stores temporary data calculated during operation by the CPU 300. Computer readable mediums such as semiconductor memories, magnetic memories, optical discs, and magneto optical discs can be used for the program memory 330 and the temporary memory 331, for example.

Figure 7:
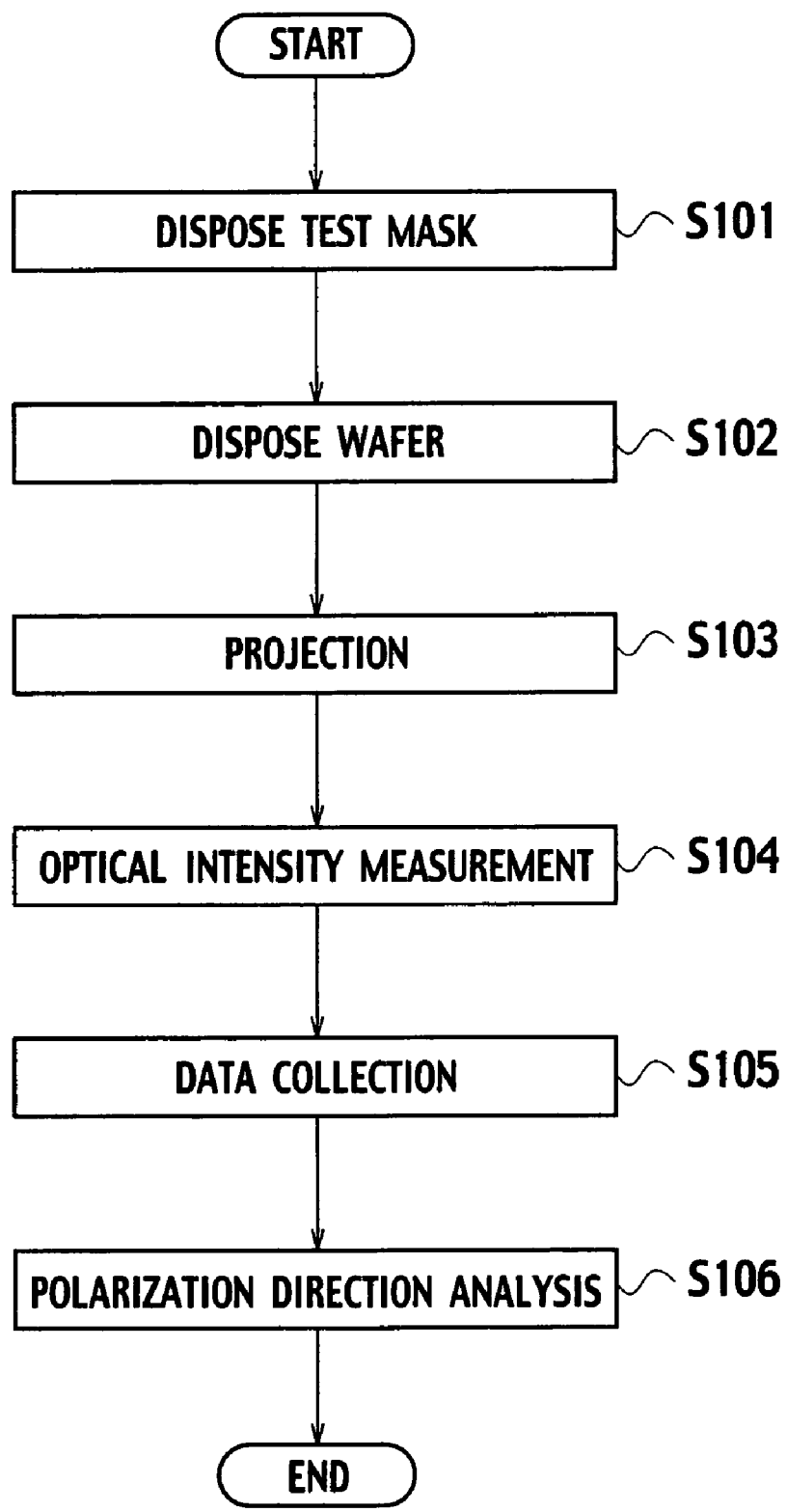
FIG. 7 is a flowchart depicting a method for monitoring the polarization in accordance with the first embodiment of the present invention.

With reference next to FIG. 7, a method for monitoring the polarization according to the first embodiment of the present invention is described.

In step S101, the test mask 5 for monitoring the polarization is disposed on the reticle stage 11 in the exposure tool 200. Also, the polarizer is inserted into the polarizer holder 6. In step S102, the wafer 31 is prepared and disposed on the wafer stage 32. In step S103, the light is emitted from the light source 3. Then, the plurality of grating patterns 10a-10h shown in FIG. 3 are projected onto the plurality of test areas on the surface of the wafer 31 by the linearly polarized light, respectively.

In step S104, the camera 21 shown in FIG. 2 detects the light intensities "I" on the test areas where the grating patterns 10a-10h are projected, respectively. In step S105, the data collector 309 shown in FIG. 1 collects the optical intensity "I" on the test area where the grating pattern 10a shown in FIG. 3 is projected as the first test optical intensity datum "$I_1$". Also, the data collector 309 shown in FIG. 1 collects the light intensities "I" on the test areas where the grating patterns 10b-10h shown in FIG. 3 are projected as the second to eighth test optical intensity data "$I_1$"-"$I_2$", respectively.

In step S106, the polarization direction monitor 311 shown in FIG. 1 compares the first test optical intensity datum "$I_1$", the second test optical intensity datum "$I_2$", the third test optical intensity datum "$I_3$", the fourth test optical intensity datum "$I_4$", the fifth test optical intensity datum "$I_5$", the sixth test optical intensity datum "$I_6$", the seventh test optical intensity datum "$I_7$", and the eighth test optical intensity datum "$I_8$" and then determines the polarization direction of the linearly polarized light irradiated on the test mask 5 for monitoring the polarization disposed in the exposure tool 200 shown in FIG. 2.

As described above, the exposure system shown in FIG. 1, the test mask 5 for monitoring the polarization shown in FIGS. 3 and 4, and the method for monitoring the polarization shown in FIG. 7 makes it possible to monitor the polarization direction of the linearly polarized light precisely even if the projection lens 13 in the exposure tool 200 shown in FIG. 2 has the astigmatism. Generally, all surface of the wafer 31 does not agree with the focus point of the projection lens 13 because of the astigmatism. Therefore, the optical intensity "I" measured by earlier methods may contain an error caused by the astigmatism.

On the contrary, the test mask 5 for monitoring the polarization shown in FIGS. 3 and 4 includes the plurality of shield patterns 100a-100c spaced apart at the space width "$p_s$" satisfying the equation (3). Therefore, as shown in FIG. 5, the higher order diffracted lights generated by the plurality of shield patterns 100a-100c do not penetrate the projection lens 13. Consequently, the measured light intensities "I" on the test areas where the grating patterns 10a-10h are projected, respectively, are not affected by the astigmatism. Thus, monitoring the polarization direction of the linearly polarized light precisely is achieved.

(First Modification)

Figure 8:
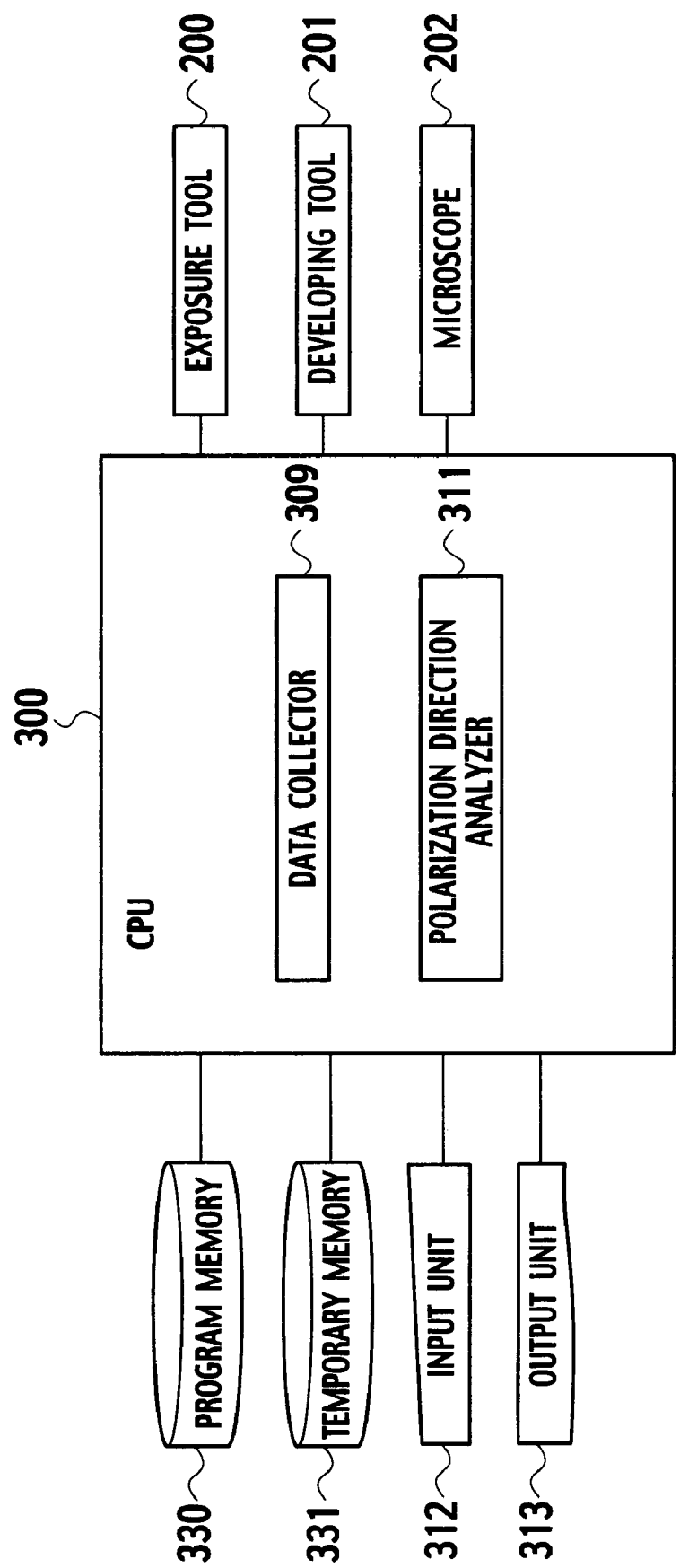
FIG. 8 is a diagram of the exposure system in accordance with a first modification of the first embodiment of the present invention.

With reference to FIG. 8, an exposure system according the first modification further includes a developing tool 201 and a microscope 202. Other components of the exposure system are similar to the exposure system shown in FIG. 1. In the first modification of the first embodiment, a resist layer is coated on the wafer 31 shown in FIG. 2 and the plurality of the grating patterns 10a-10h shown in FIG. 3 are projected onto the plurality of test areas defined on the resist layer in the exposure tool 200. The developing tool 201 is configured to develop the resist layer coated on the wafer 31. Developing conditions such as the concentration of a developer, a developer temperature, and a developing time can be adjusted in the developing tool 201.

Figure 9:
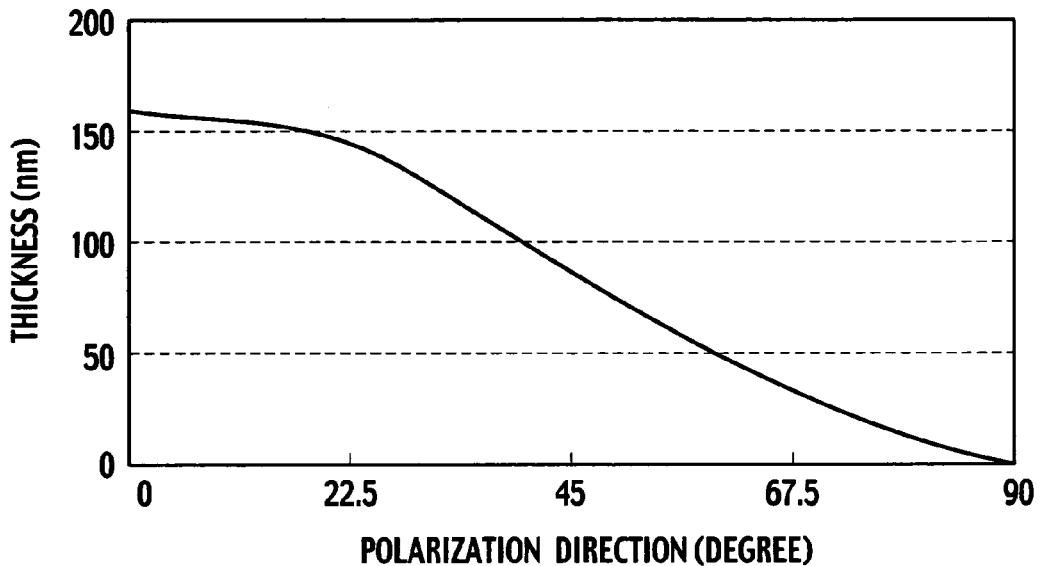
FIG. 9 is a graph showing the thickness of a resist layer versus polarization direction in accordance with the first modification of the first embodiment of the present invention.

The microscope 202 shown in FIG. 8 is configured to measure each thickness of portions of the developed resist layer where the grating patterns 10a-10h are projected after the development. The spectroscope can be used for the microscope 202, for example. When the grating pattern 10a shown in FIG. 4 is projected onto the resist layer having the thickness of 250 nm by the linearly polarized light of 14 mJ and then the resist layer is developed, a relationship between the thickness of the developed resist layer where the grating pattern 10a is projected and the polarization direction of the linearly polarized light is shown in FIG. 9. When the polarization direction of the linearly polarized light is close to the longer direction (0 degree) of the grating pattern 10a, the thickness of the developed resist layer becomes thick. When the polarization direction of the linearly polarized light is close to orthogonal to the longer direction of the grating pattern 10a, the thickness of the developed resist layer becomes thin. Similar phenomena are observed at the portions of the developed resist layer where the grating patterns 10b-10c shown in FIG. 3 are projected.

As described with FIG. 6, the light intensities "I" of the test areas where the grating patterns 10a-10c are projected on the resist layer varies depending on the polarization direction of the linearly polarized light. Accordingly, each thickness of the portions of the developed resist layer where the plurality of grating patterns 10a-10c are projected varies depending on the polarization direction of the linearly polarized light. Therefore, each thickness of the portions of the developed resist layer where the plurality of grating patterns 10a-10c are projected reflects the optical intensity "I" on each of the test areas where the grating patterns 10a-10c are projected.

In the first modification of the first embodiment, the data collector 309 shown in FIG. 8 collects each thickness of the portions of the developed resist layer where the plurality of grating patterns 10a-10c are projected, respectively, as the first test optical intensity datum "$I_1$", the second test optical intensity datum "$I_2$", the third test optical intensity datum "$I_3$", the fourth test optical intensity datum "$I_4$", the fifth test optical intensity datum "$I_5$", the sixth test optical intensity datum "$I_6$", the seventh test optical intensity datum "$I_7$", and the eighth test optical intensity datum "$I_8$" from the microscope 202.

The polarization direction monitor 311 compares the first test optical intensity datum "$I_1$", the second test optical intensity datum "$I_2$", the third test optical intensity datum "$I_3$", the fourth test optical intensity datum "$I_4$", the fifth test optical intensity datum "$I_5$", the sixth test optical intensity datum "$I_6$", the seventh test optical intensity datum "$I_7$", and the eighth test optical intensity datum "$I_8$" to determine the polarization direction of the linearly polarized light irradiated on the test mask 5 for monitoring the polarization in the exposure tool 200 shown in FIG. 2 as similar to the first embodiment.

Figure 10:
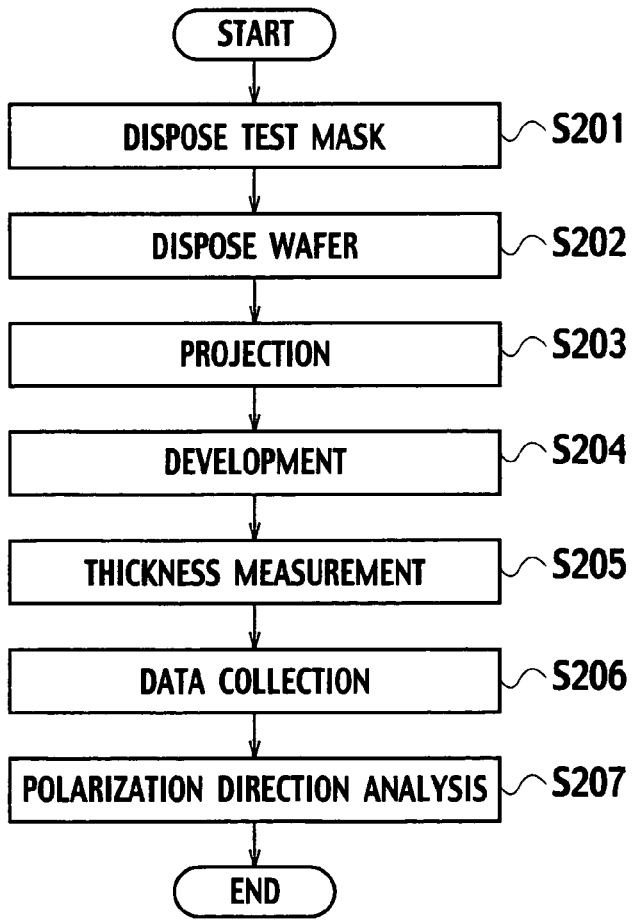
FIG. 10 is a flowchart depicting the method for monitoring polarization in accordance with the first modification of the first embodiment of the present invention.

With reference next to FIG. 10, a method for monitoring the polarization according to the first modification of the first embodiment of the present invention is described.

Step S201 to step S203 are carried out as similar to step S101 to step S103 of FIG. 7. In step S204, the resist layer coated on the wafer 31 shown in FIG. 2 is developed by the developing tool 201 shown in FIG. 8. In step S205, the microscope 202 measures each thickness of the portions of the developed resist layer where the plurality of grating patterns 10a-10h shown in FIG. 3 are projected.

In step S206, the data collector 309 shown in FIG. 8 collects each thickness of the portions of the developed resist layer where the plurality of grating patterns 10a-10c are projected, respectively, as the first test optical intensity datum "$I_1$", the second test optical intensity datum "$I_2$", the third test optical intensity datum "$I_3$", the fourth test optical intensity datum "$I_4$", the fifth test optical intensity datum "$I_5$", the sixth test optical intensity datum "$I_6$", the seventh test optical intensity datum "$I_7$", and the eighth test optical intensity datum "$I_8$" from the microscope 202.

In step S207, the polarization direction monitor 311 compares the first test optical intensity datum "$I_1$", the second test optical intensity datum "$I_2$", the third test optical intensity datum "$I_3$", the fourth test optical intensity datum "$I_4$", the fifth test optical intensity datum "$I_5$", the sixth test optical intensity datum "$I_6$", the seventh test optical intensity datum "$I_7$", and the eighth test optical intensity datum "$I_8$" to determine the polarization direction of the linearly polarized light irradiated on the test mask 5 for monitoring the polarization in the exposure tool 200 shown in FIG. 2 as similar to the first embodiment.

As described above, measuring each thickness of the portions of the developed resist layer where the plurality of grating patterns 10a-10c are projected also makes it possible to monitor the polarization direction of the linearly polarized light in the exposure tool 200 shown in FIG. 2.

(Second Modification)

Figure 11:
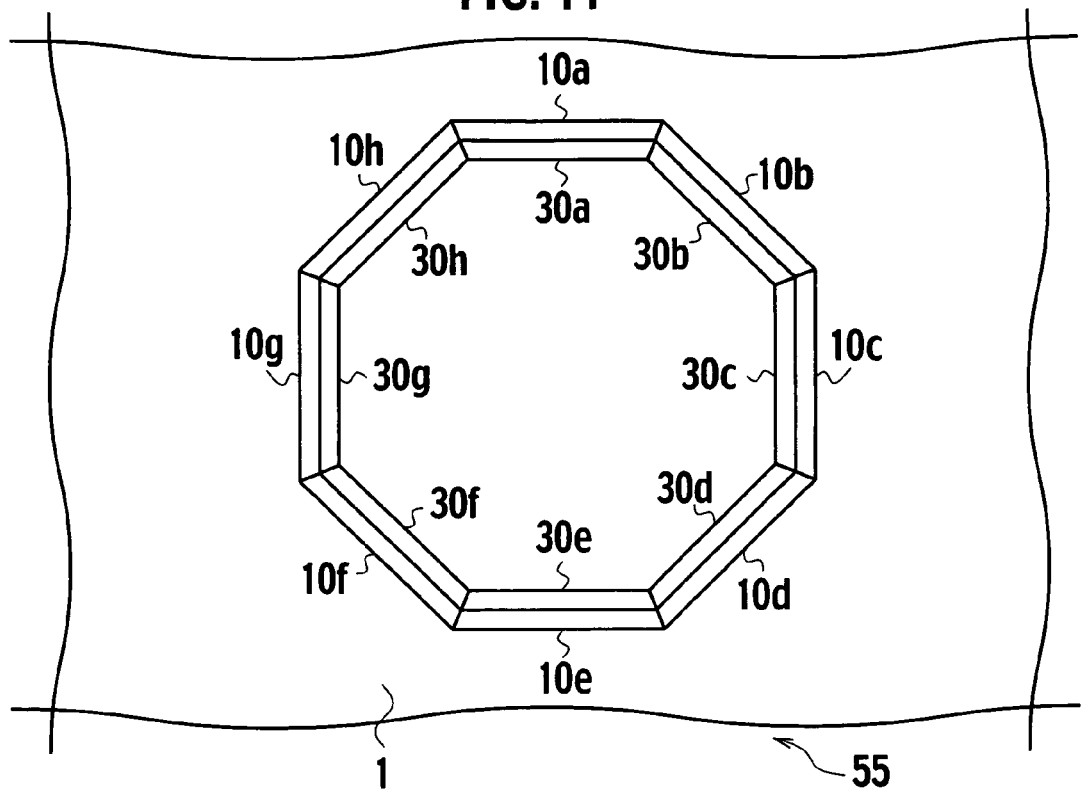
FIG. 11 is a plan view of the test mask for monitoring the polarization in accordance with a second modification of the first embodiment of the present invention.

With reference to FIG. 11, a test mask 55 for monitoring the polarization according to the second modification of the first embodiment further includes a plurality of reference patterns 30a, 30b, 30c, 30d, 30e, 30f, 30g, and 30h. The plurality of reference patterns 30a-30h are disposed on the mask substrate 1 along the plurality of grating patterns 10a-10h, respectively. Each of the plurality of reference patterns 30a-30h has a line width enough to form a projected image on the wafer 31 in the exposure tool 200 shown in FIG. 2. Each of the plurality of reference patterns 30a-30h is a shield layer composed of Cr, for example. Other components of the test mask 55 for monitoring the polarization shown in FIG. 11 are similar to the test mask 5 shown in FIG. 3.

Figure 12:
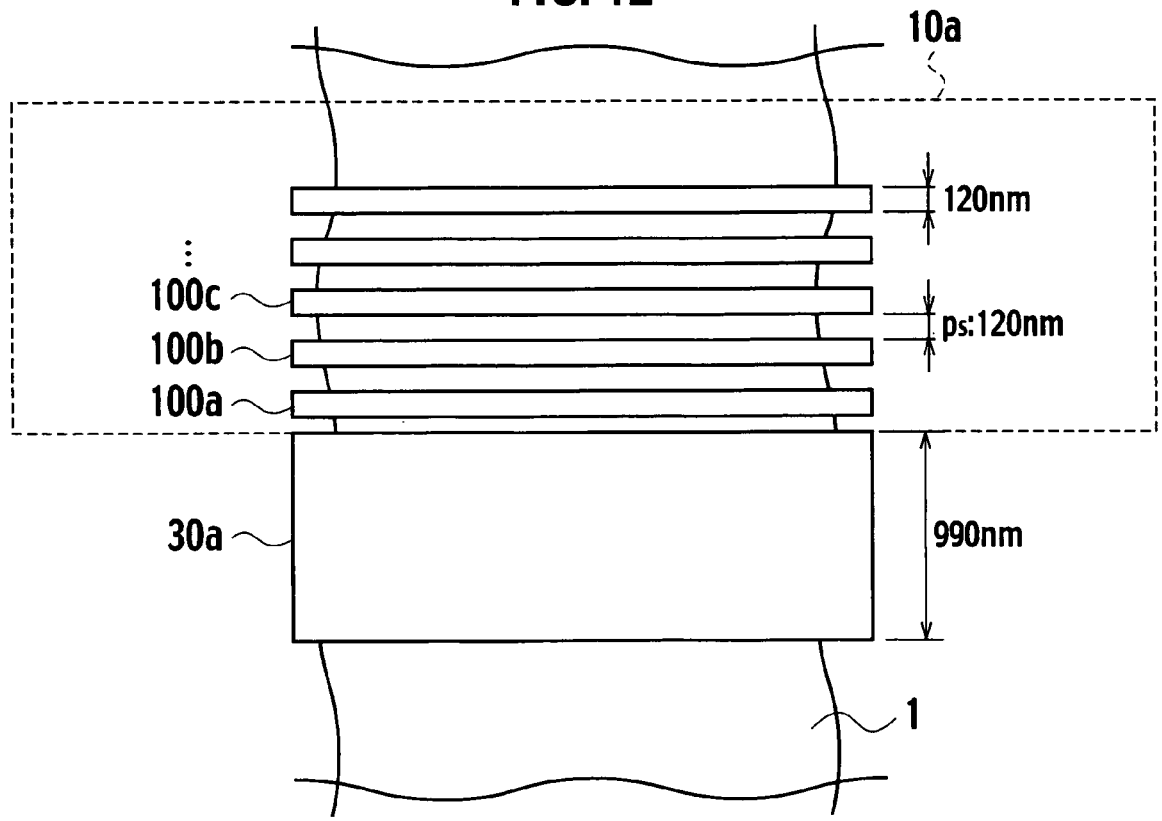
FIG. 12 is an enlarged plan view of the test mask for monitoring the polarization in accordance with the second modification of the first embodiment of the present invention.

In FIG. 12, an enlarged plan view of the test mask 55 for monitoring the polarization is shown. The example line width of the reference pattern 30a is 990 nm. In the grating pattern 10a, a plurality of parallel shield patterns 100a-100c are spaced apart at the space width "$p_s$" of 120 nm. The reference pattern 30a and the shield pattern 100a adjacent to the reference pattern 30a are also spaced apart at 120 nm. Each of enlarged plan views of the grating patterns 10b-10h and the reference patterns 30b-30h shown in FIG. 11 is similar to FIG. 12.

When the k-factor "$k_1$" is 0.61, the wavelength of the light "$\lambda$" is 193 nm, and the NA of the projection lens 13 is 0.75, for example, the resolution limit "R" that is the minimum feature size that can be lithographically printed by the exposure tool 200 shown in FIG. 2 is 157 nm from the equation (1). If the magnification "M" of the projection lens 13 in the exposure tool 200 is ¼ and the grating pattern 10a adjacent to the reference pattern 30a shown in FIG. 12 did not exist, a projected image of the reference pattern 30a may have a line width of 247.5 nm. However, the plurality of shield patterns 100a-100c in the grating pattern 10a are spaced apart at the space width "$p_s$" satisfying the equation (3). Therefore, when the polarization direction of the linearly polarized light is close to orthogonal to the longer direction of the grating pattern 10a, the optical intensity "I" on the test area where the grating pattern 10a is projected becomes high as shown in FIG. 6. On the contrary, when the polarization direction of the linearly polarized light is close to parallel to the longer direction of the grating pattern 10a, the optical intensity "I" on the test area where the grating pattern 10a is projected becomes low. Accordingly, when the polarization direction of the linearly polarized light is close to orthogonal to the longer direction of the grating pattern 10a, the line width of the projected image of the reference pattern 30a shown in FIG. 12 becomes narrow. Also, when the polarization direction of the linearly polarized light is close to parallel to the longer direction of the grating pattern 10a, the line width of the projected image of the reference pattern 30a becomes thick.

Figure 13:
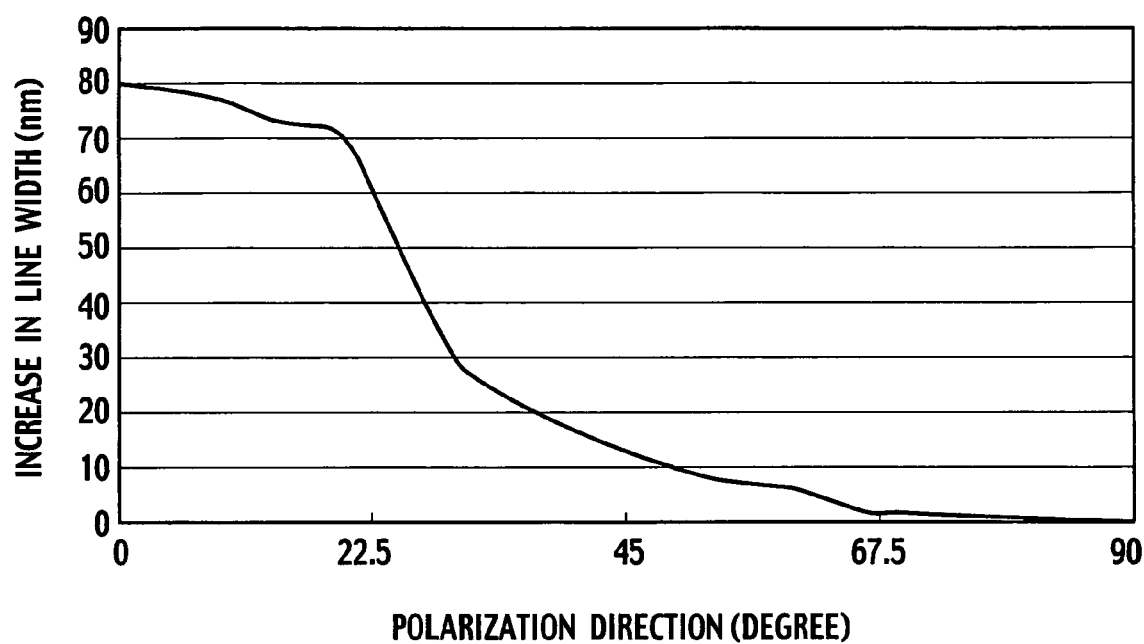
FIG. 13 is a graph showing an increase in line width of a projected pattern versus the polarization direction in accordance with the second modification of the first embodiment of the present invention.

FIG. 13 shows an increase in the line width of the projected image of the reference pattern 30a shown in FIG. 12 as a function of the polarization direction when the light of 16 mJ is emitted from the light source 3 shown in FIG. 2. As shown in FIG. 13, if the polarization direction is changed from 90 degrees to 0 degree, the line width of the projected image of the reference pattern 30a is increased. Similar phenomenon is observed in each line width of the projected images of the reference patterns 30b-30h shown in FIG. 11. Therefore, by comparing the plurality of line widths of the projected images of the reference patterns 30a-30h, it is possible to monitor the polarization direction of the linearly polarized light.

Figure 14:
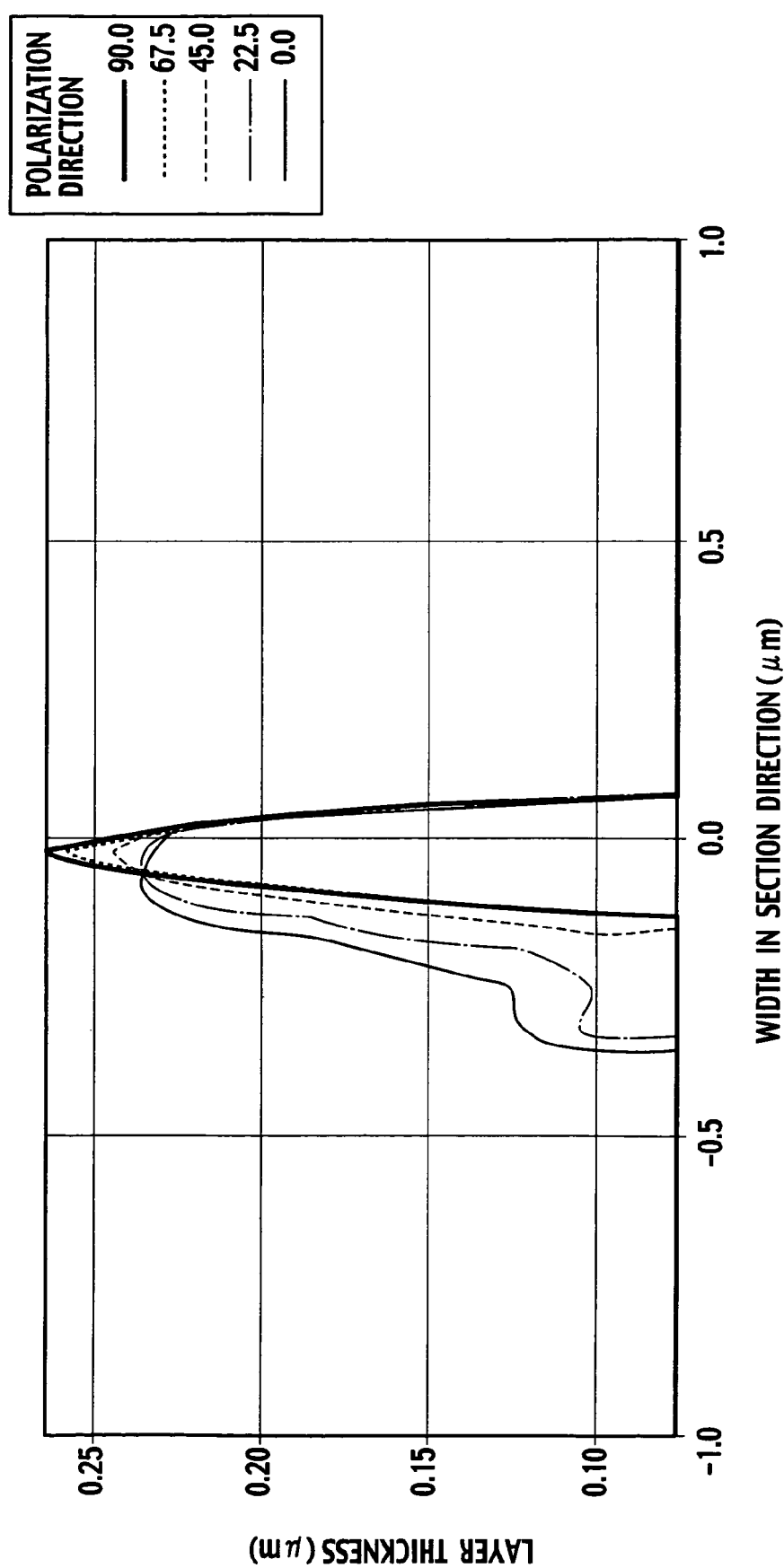
FIG. 14 is a graph showing a relationship between the line width of a resist pattern and the polarization direction in accordance with the second modification of the first embodiment of the present invention.

After the reference pattern 30a and the grating pattern 10a are projected on the resist layer on the wafer 31 and the resist layer is developed, a resist pattern is formed on the wafer 31. A sectional profile of the resist pattern is shown in FIG. 14. When the polarization direction is close to 0 degree, the optical intensity "I" on the test area where the grating pattern 10a is projected becomes low. Therefore, a sidewall of the resist pattern slopes to the test area. As a result, the line width of the resist pattern is increased.

As describe in the first embodiment, when the space width "$p_s$" of the plurality of shield patterns 100a-100c shown in FIG. 12 satisfies the equation (3), the defocus does not affect the optical intensity "I" on each of the test areas where the grating patterns 10a-10h are projected on the wafer 31 shown in FIG. 2. In addition, since each line width of the plurality of reference patterns 30a-30h is 1.5 times as large as the resolution limit "R" of the exposure tool 200, the defocus caused by the aberration of the projection lens 13 does not affect the line widths of the projected images of the reference patterns 30a-30h on the wafer 31. Therefore, even if the projection lens 13 in the exposure tool 200 has the astigmatism, positions of the plurality of grating patterns 10a-10h and the plurality of reference patterns 30a-30h on the mask substrate 1 do not affect the plurality of line widths of the plurality of projected images of the reference patterns 30a-30h.

Next, the method for monitoring the polarization employing the exposure system shown in FIG. 1 and the test mask 55 for monitoring the polarization shown in FIG. 11 is described. Step S101 to Step S103 of FIG. 7 are carried out as similar to the first embodiment by using the test mask 55 for monitoring the polarization. The plurality of reference patterns 30a-30h are projected onto a plurality of reference areas on the wafer 31.

In step S104, each line width of the projected images of the plurality of reference patterns 30a-30h shown in FIG. 11 is detected by the camera 21 shown in FIG. 2. In step S105, the data collector 309 shown in FIG. 1 collects the line widths of the projected images of the plurality of reference patterns 30a-30h as the first test optical intensity datum "$I_1$", the second test optical intensity datum "$I_2$", the third test optical intensity datum "$I_3$", the fourth test optical intensity datum "$I_4$", the fifth test optical intensity datum "$I_5$", the sixth test optical intensity datum "$I_6$", the seventh test optical intensity datum "$I_7$", and the eighth test optical intensity datum "$I_8$", respectively. Then, step S106 is carried out as similar to the first embodiment and the polarization direction of the light is monitored.

Alternatively, the method for monitoring the polarization is carried out by employing the exposure system shown in FIG. 8 and the test mask 55 for monitoring the polarization shown in FIG. 11. In this case, step S201 to step S204 of FIG. 10 are carried out as similar to the first modification of the first embodiment by employing the test mask 55 for monitoring the polarization. In step S205, the microscope 202 shown in FIG. 8 measures each line width of the resist patterns corresponding to the reference patterns 30a-30h shown in FIG. 11, respectively. In step S206, the data collector 309 collects the line widths of the resist patterns as the first test optical intensity datum "$I_1$", the second test optical intensity datum "$I_2$", the third test optical intensity datum "$I_3$", the fourth test optical intensity datum "$I_4$", the fifth test optical intensity datum "$I_5$", the sixth test optical intensity datum "$I_6$", the seventh test optical intensity datum "$I_7$", and the eighth test optical intensity datum "$I_8$", respectively. Then step S207 is carried out as similar to the first modification of the first embodiment and the polarization direction of the linearly polarized light is monitored.

(Third Modification)

Figure 15:
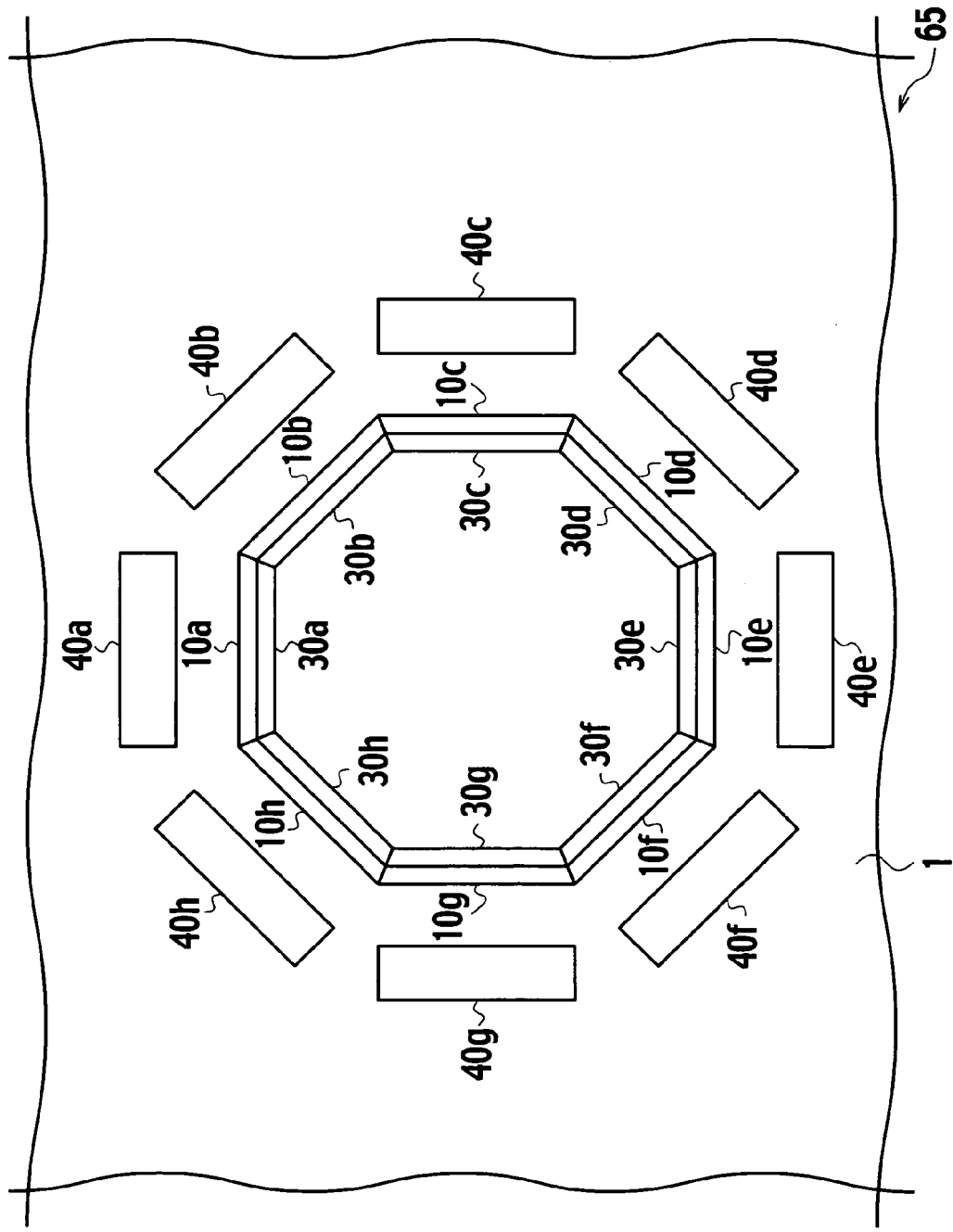
FIG. 15 is a plan view of the test mask for monitoring the polarization in accordance with a third modification of the first embodiment of the present invention.

With reference to FIG. 15, a test mask 65 for monitoring the polarization according to the third modification of the first embodiment further includes a plurality of standard patterns 40a, 40b, 40c, 40d, 40e, 40f, 40g, and 40h disposed on the mask substrate 1. The plurality of standard patterns 40a-40h are parallel to the plurality of grating patterns 10a-10h, respectively. Each of the plurality of standard patterns 40a-40h is a shield layer composed of Cr, for example. Each of the plurality of standard patterns 40a-40h has the line width enough to form a projected image on the wafer 31 in the exposure tool 200 shown in FIG. 2. Other components of the test mask 65 for monitoring the polarization are similar to the test mask 55 shown in FIG. 11.

As described with FIG. 13, the polarization direction of the linearly polarized light creates measurable shifts in sides of projected images of the reference patterns 30a- 30h adjacent to the test areas where the grating patterns 10a-10h are projected, respectively. Therefore, distances between the projected standard patterns 40a-40h shown in FIG. 15 and the sides of the projected reference patterns 30a-30h adjacent to the test areas where the grating patterns 10a-10h are projected reflect the polarization direction of the linearly polarized light. Accordingly, by measuring the distances, it is possible to monitor the polarization direction of the linearly polarized light.

Also, the polarization direction of the linearly polarized light creates measurable shifts in a side of the projected reference pattern 30a adjacent to the test area where the grating pattern 10a is projected and a side of the projected reference pattern 30e adjacent to the test area where the grating pattern 10e is projected in opposite directions, respectively. Similar phenomena are observed in combinations such as the reference patterns 30b, 30f of which longer directions are parallel. Therefore, by using the test mask 65 for monitoring the polarization, a double effect is obtained. Consequently, the test mask 65 for monitoring the polarization provides a precise measurement of the optical intensity "I" on each of the test areas where the grating patterns 10a-10h are projected.

(Fourth Modification)

Figure 16:
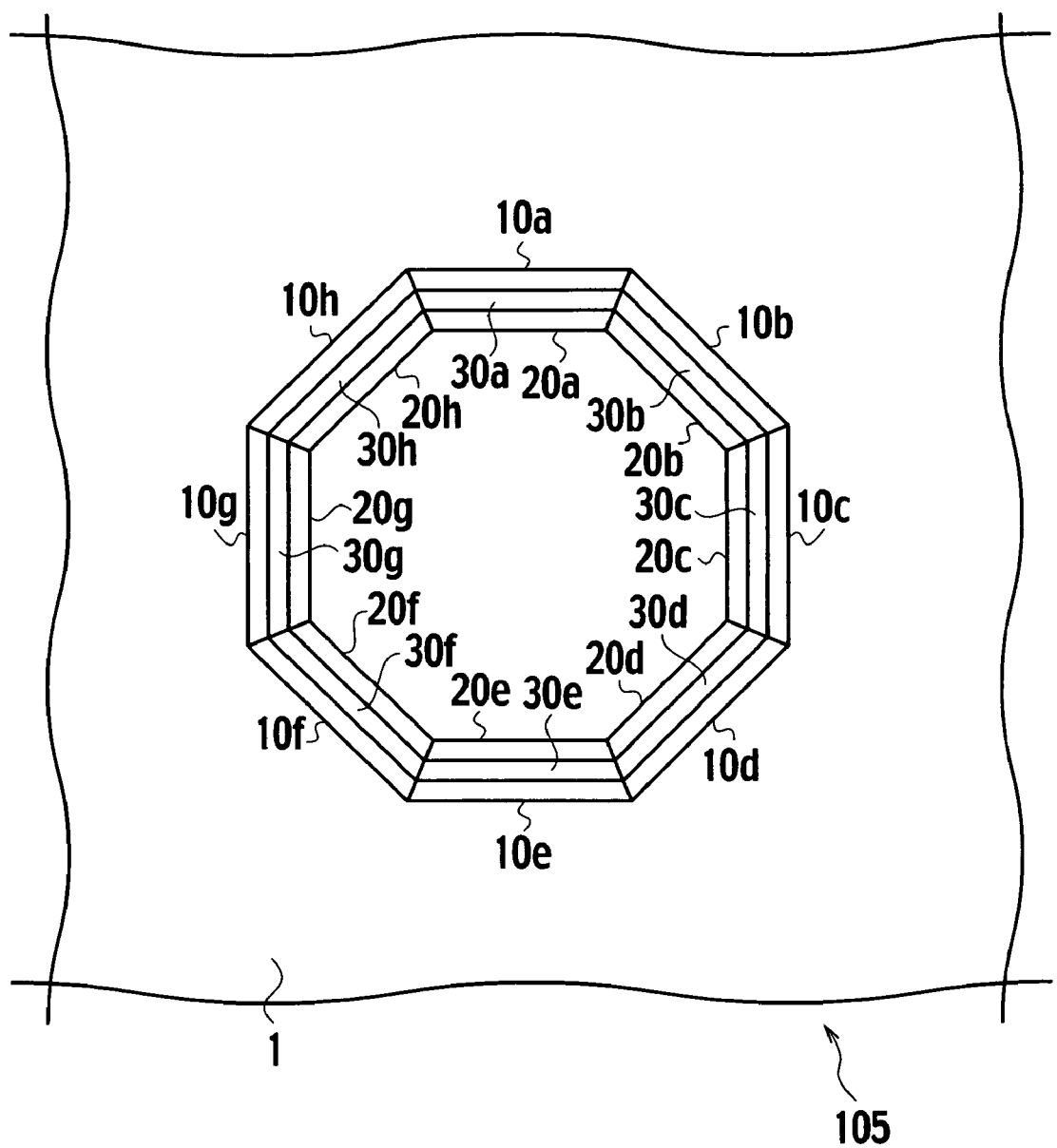
FIG. 16 is a plan view of the test mask for monitoring the polarization in accordance with a fourth modification of the first embodiment of the present invention.

With reference to FIG. 16, a test mask 105 for monitoring the polarization according to the fourth modification of the first embodiment further includes a plurality of grating patterns 20a, 20b, 20c, 20d, 20e, 20f, 20g, and 20h. The plurality of reference patterns 30a-30h are interposed between the plurality of grating patterns 10a-10h and the plurality of grating patterns 20a-20h. Each of the plurality of grating patterns 20a-20h has the space width "$p_s$" preventing the higher order diffracted lights from the image formation in the exposure tool 200 shown in FIG. 2. Other components of the test mask 105 for monitoring the polarization are similar to the test mask 55 shown in FIG. 11.

Figure 17:
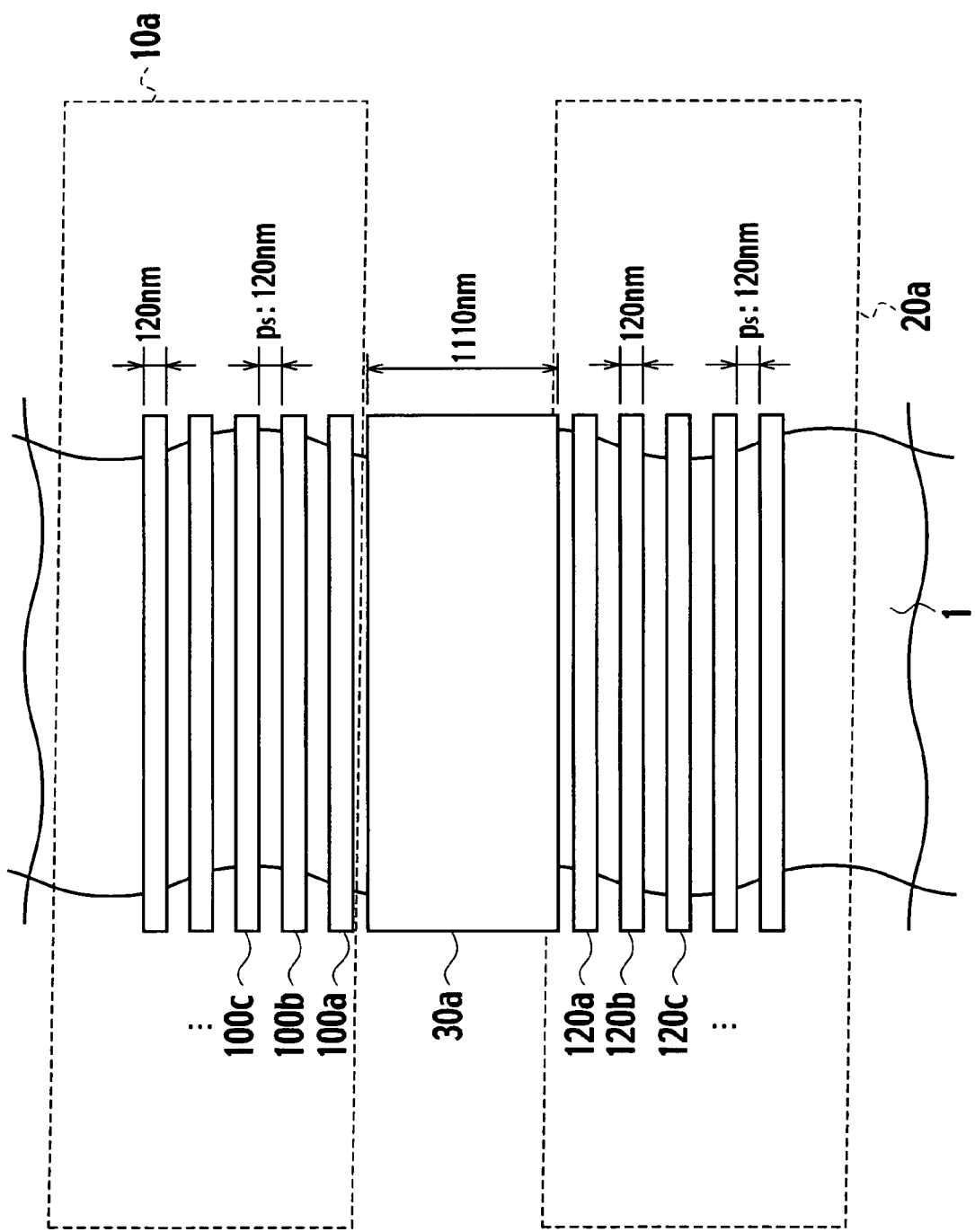
FIG. 17 is an enlarged plan view of the test mask for monitoring the polarization in accordance with the fourth modification of the first embodiment of the present invention.

An enlarged plan view of the test mask 105 for monitoring the polarization is shown in FIG. 17. The grating pattern 20a includes a plurality of shield patterns 120a, 120b, and 120c disposed on the mask substrate 1. Each of the plurality of shield patterns 120a-120c is composed of Cr, for example. The plurality of parallel shield patterns 120a-120c are spaced apart at the space width "$p_s$" of 120 nm. The reference pattern 30a has a line width of 1,110 nm. The reference pattern 30a and the shield pattern 100a adjacent to the reference pattern 30a are also spaced apart at 120 nm. Each enlarged plan view of the plurality of grating patterns 10b-10h shown in FIG. 16, the plurality of reference patterns 30b-30h, and the plurality of grating patterns 20b-20h is similar to FIG. 17.

Figure 18:
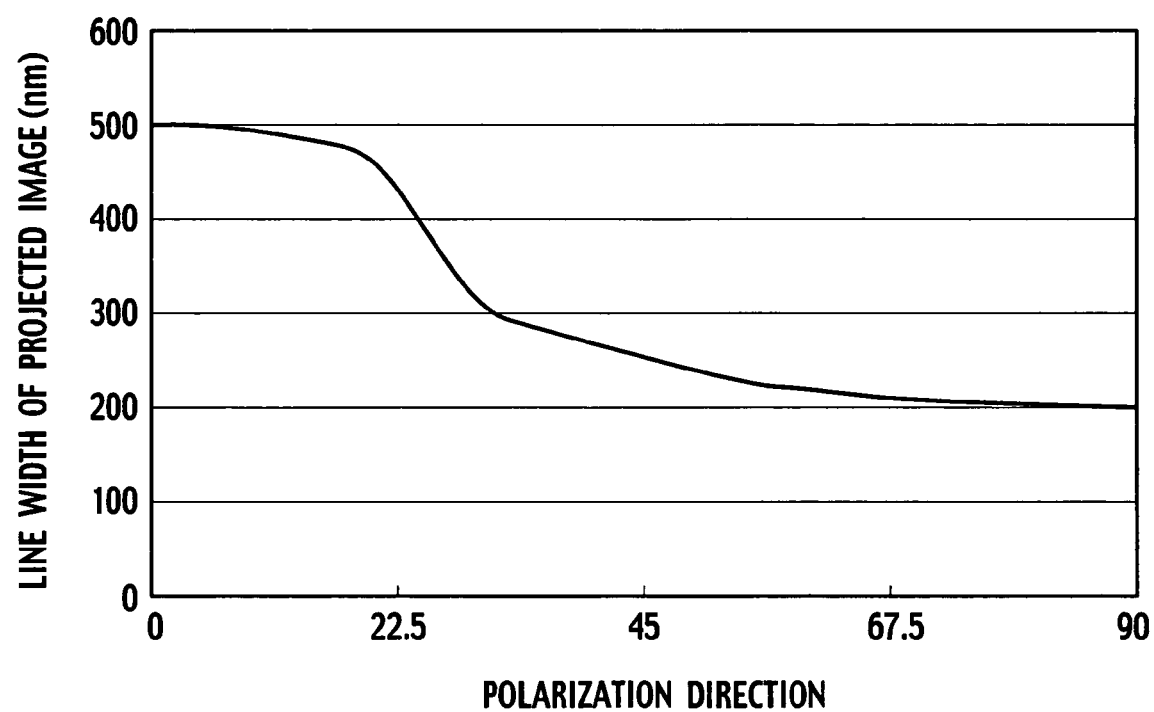
FIG. 18 is a graph showing the line width of the projected image versus the polarization direction in accordance with the fourth modification of the first embodiment of the present invention.

As described with FIG. 13, when the test mask 105 for monitoring the polarization shown in FIG. 16 is disposed in the exposure tool 200 shown in FIG. 2, the polarization direction of the linearly polarized light changes the line widths of the projected reference patterns 30a-30h. FIG. 18 shows the line width of the projected image of the reference pattern 30a versus the polarization direction of the linearly polarized light. When the polarization direction of the linearly polarized light is close to orthogonal to the longer direction of the grating pattern 10a, the line width of the projected image of the reference pattern 30a becomes thin. On the contrary, when the polarization direction of the light is close to parallel to the longer direction of the grating pattern 10a, the line width of the projected image of the reference pattern 30a becomes thick. Similar phenomena are observed in the line widths of the projected images of the reference patterns 30b-30h. Therefore, by comparing the line widths of the projected images of the plurality of reference patterns 30a-30h, it is possible to monitor the polarization direction of the linearly polarized light.

Second Embodiment

Figure 19:
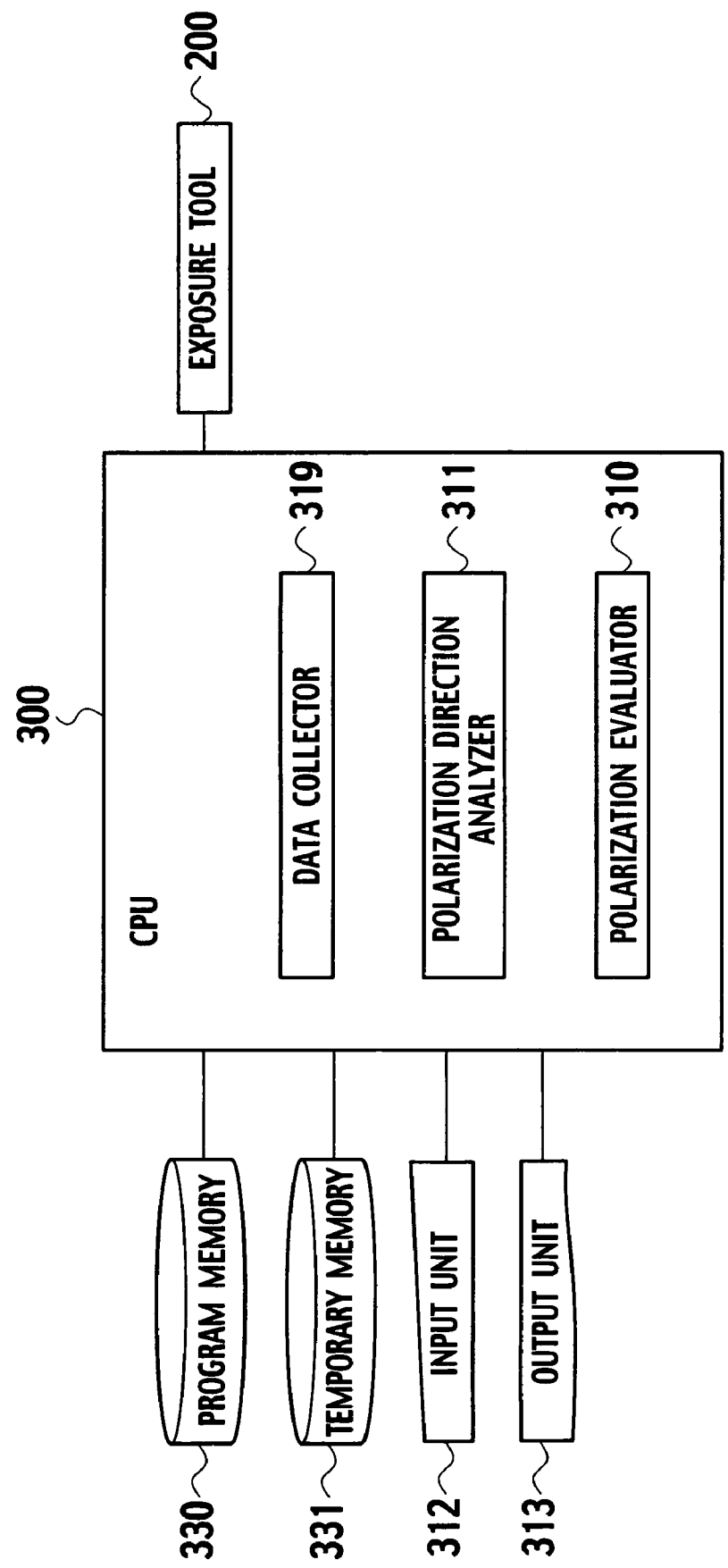
FIG. 19 is a diagram of the exposure system in accordance with a second embodiment of the present invention.

With reference to FIG. 19, a data collector 319 of the exposure system according to the second embodiment collects the first to eighth test optical intensity data "$I_1$"-"$I_8$" as does the data collector 309 shown in FIG. 1. When the quarter wave plate is inserted in the wave plate holder 17 shown in FIG. 2 and the light passing through the quarter wave plate forms a right hand circularly polarized light, the data collector 319 further collects optical intensity "I" on a first area where the grating pattern 10a is projected as a first optical intensity datum "$I_R$" on the first area. Also, when the light passing through the quarter wave plate forms a left hand circularly polarized light, the data collector 319 collects optical intensity "I" on a second area where the grating pattern 10a is projected as a second optical intensity datum "$I_L$" on the second area. It should be noted that any one of the projection areas of the grating patterns 10a-10h can be selected for collecting the first optical intensity datum "$I_R$" on the first area and the second optical intensity datum "$I_L$" on the second area.

With reference again to FIG. 19, the exposure system further includes a polarization evaluator 310. The polarization evaluator 310 is configured to evaluate a polarization state of the linearly polarized light passing through the polarizer held in the polarizer holder 16 shown in FIG. 2, based on the first to eighth test optical intensity data "$I_1$"-"$I_8$" on the test areas, the first optical intensity datum "$I_R$" on the first area, and the second optical intensity datum "$I_L$" on the second area. To evaluate the polarization state of the linearly polarized light, the polarization evaluator 310 employs the Stokes parameters. The "Stokes parameters" include four parameters "$s_0$", "$s_1$", "$s_2$" and "$s_3$" given by following equations (4)-(7):

$$s_0 = I_0 + I_{90} \quad (4)$$

$$s_1 = I_0 - I_{90} \quad (5)$$

$$s_2 = I_{45} - I_{135} \quad (6)$$

$$s_3 = I_R - I_L \quad (7)$$

where "$I_0$" is any one of the first to eighth test optical intensity data "$I_1$"-"$I_8$". For example, when the first test optical intensity datum "$I_1$" is chosen as a variable "$I_0$", a variable "$I_{45}$" is the second test optical intensity datum "$I_2$" on the test area where the grating pattern 10b meeting the grating pattern 10a at an angle of 45 degrees as shown in FIG. 3 is projected. A variable "$I_{90}$" is the third test optical intensity datum "$I_3$" on the test area where the grating pattern 10c meeting the grating pattern 10a at an angle of 90 degrees is projected. A variable "$I_{135}$" is the fourth test optical intensity datum "$I_4$" on the test area where the grating pattern 10d meeting the grating pattern 10a at an angle of 135 degrees is projected.

When the light is completely polarized, the four parameters "$s_0$", "$s_1$", "$s_2$", and "$s_3$" satisfies following equation (8). When the light is partially polarized, the four parameters "$s_0$", "$s_1$", "$s_2$", and "$s_3$" satisfies following equation (9).

$$s_0^2 = s_1^2 + s_2^2 + s_3^2 \quad (8)$$

$$s_0^2 > s_1^2 + s_2^2 + s_3^2 \quad (9)$$

The polarization evaluator 310 shown in FIG. 19 calculates the Stokes parameters "$s_0$", "$s_1$", "$s_2$", and "$s_3$" by using the equations (4), (5), (6), and (7). When the Stokes parameters "$s_0$", "$s_1$", "$s_2$", and "$s_3$" satisfy the equation (8), the polarization evaluator 310 evaluates the light as the completely polarized light. When the Stokes parameters "$s_0$", "$s_1$", "$s_2$", and "$s_3$" satisfy the equation (9), the polarization evaluator 310 evaluates the light as the partially polarized light. Other components of the exposure system shown in FIG. 19 are similar to FIG. 1.

Figure 20:
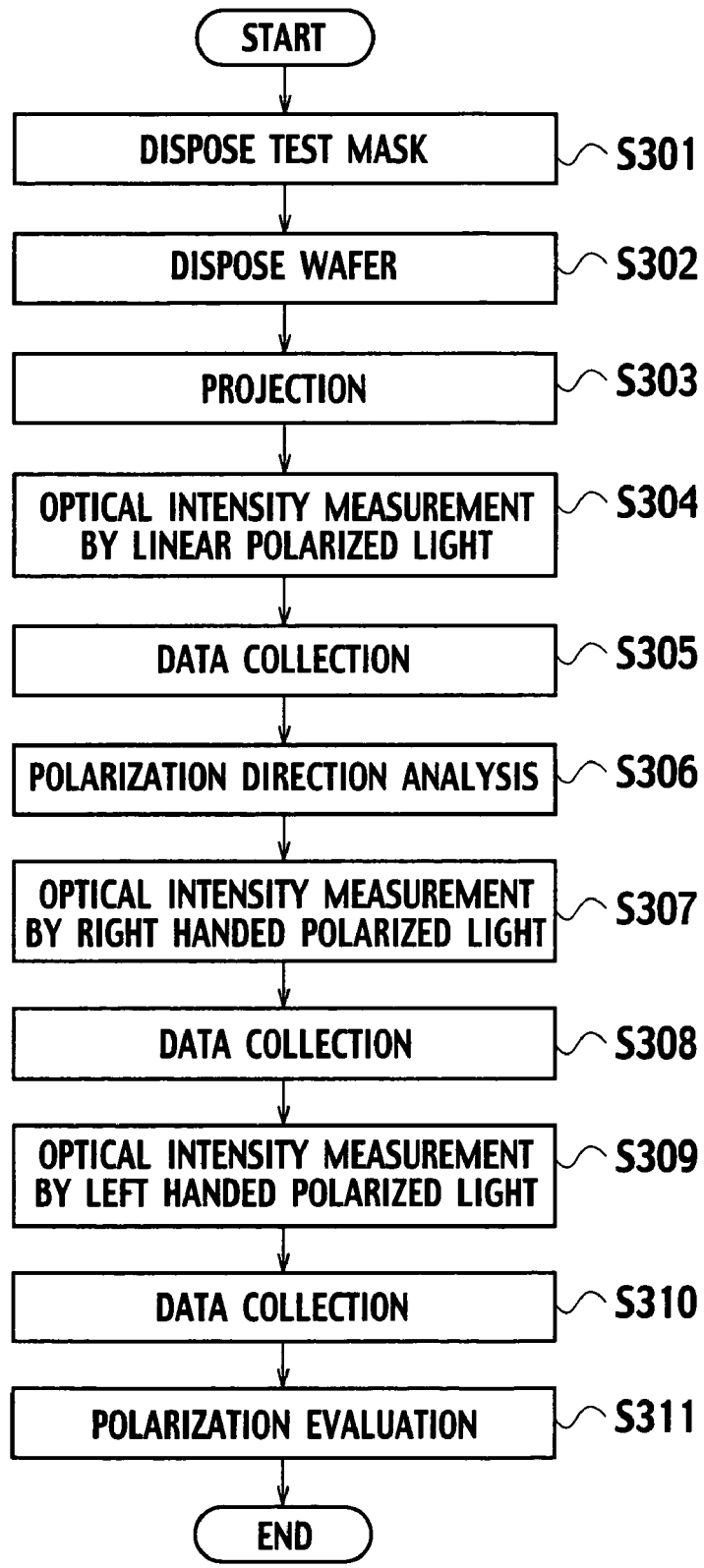
FIG. 20 is a flowchart depicting the method for monitoring the polarization in accordance with the second embodiment of the present invention.

With reference to FIG. 20, a method for monitoring the polarization according to the second embodiment is described.

Step S301 to step S306 are carried out as similar to step S101 to step S106 of FIG. 7. In step S307, the quarter wave plate is inserted into the wave plate holder 17. Here, the polarizer holder 16 holds the quarter wave plate so that a polarization plane of the linearly polarized light makes an angle of 45 degrees with an optic axis in the quarter wave plate. Then, the camera 21 detects the optical intensity "I" on the first area where the grating pattern 10a is projected by the right circularly polarized light. In step S308, the data collector 319 shown in FIG. 19 collects the optical intensity "I" on the first area where the grating pattern 10a is projected as the first optical intensity datum "$I_R$" on the first area.

In step S309, the quarter wave plate is inserted into the polarizer holder 16 so that the polarization plane of the lineally polarized light makes an angle of 135 degrees with the optic axis in the quarter wave plate. Then, the camera 21 detects the optical intensity "I" on the second area where the grating pattern 10a is projected by the left circularly polarized light.

In step S310, the data collector 319 shown in FIG. 19 collects the optical intensity "I" on the second area where the grating pattern 10a is projected as the second optical intensity datum "$I_L$" on the second area. In step S111, the polarization evaluator 310 evaluates the polarization state of the linearly polarized light by employing the equations (4), (5), (6) (7), (8), and (9).

As described above, the exposure system shown in FIG. 19, test mask 5 for monitoring the polarization shown in FIG. 3, and the method for monitoring the polarization shown in FIG. 20 make it possible to evaluate the polarization state of the linearly polarized light precisely even though the projection lens 13 in the exposure tool 200 shown in FIG. 2 has the astigmatism.

Other Embodiments

Figure 21:
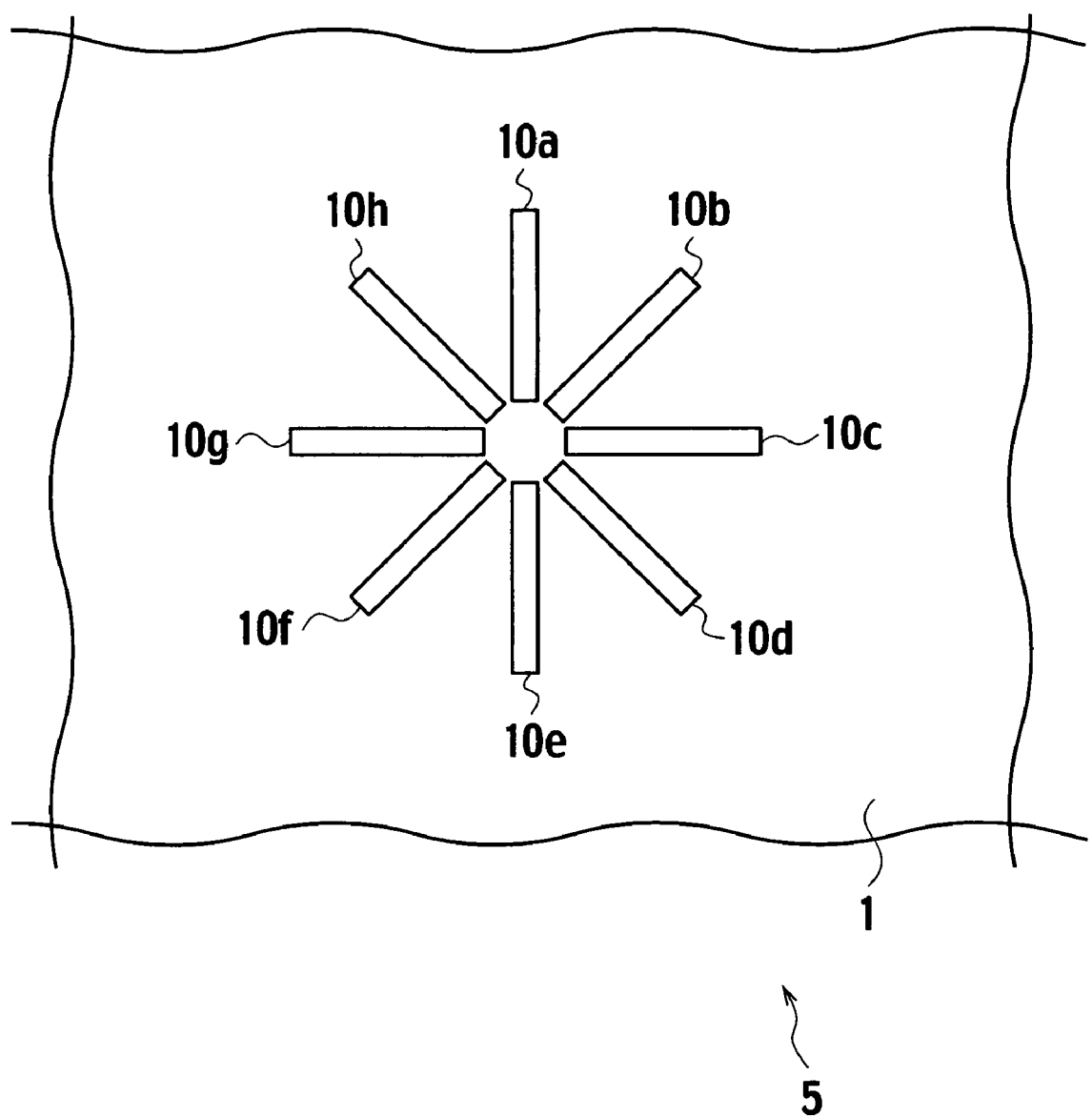
FIG. 21 is a plan view of the test mask for monitoring the polarization in accordance with other embodiments of the present invention.

Although the invention has been described above by reference to the embodiments of the present invention, the present invention is not limited to the embodiments described above. Modifications and variations of the embodiments described above will occur to those skilled in the art, in the light of the above teachings. For example, the plurality of grating patterns 10a-10h shown in FIG. 3 form an octagon in the test mask 5 for monitoring the polarization. However, the arrangement of the plurality of grating patterns 10a-10h is not limited to FIG. 3 FIG. 21 shows an alternative arrangement of the plurality of grating patterns 10a-10h. Here, an angle between longer directions of the grating patterns 10a and 10b is 45 degrees. An angle between longer directions of the grating patterns 10a and 10d is 135 degrees. An angle between longer directions of the grating patterns 10a and 10h is −45 degrees. An angle between longer directions of the grating patterns 10a and 10g is −90 degrees. An angle between longer directions of the grating patterns 10a and 10f is −135 degrees. An angle between longer directions of the grating patterns 10a and 10e is 180 degrees.

Also, to improve the precision of the method for monitoring the polarization, the test mask 5 for monitoring the polarization on the reticle stage 11 shown in FIG. 2 may be rotated 90 degrees after the method shown in FIG. 7 is carried out to determine the first polarization direction. Thereafter, the method shown in FIG. 7 may be carried out again to determine the second polarization direction of the light. Then, average of the first and second polarization directions may be employed as the polarization directions of the light. As described above, the present invention includes many variations of the embodiments. Therefore, the scope of the invention is defined with reference to the following claims.

What is claimed is:

1. An exposure system comprising:
   an exposure tool configured to project a plurality of grating patterns oriented in different directions onto a plurality of test areas by a linearly polarized light, respectively, each of the plurality of grating patterns having a space width preventing higher order diffracted lights from an image formation;
   a data collector configured to collect a plurality of sets of test optical intensity data on the plurality of test areas, respectively; and
   a polarization direction monitor configured to monitor a polarization direction of the linearly polarized light by comparing the plurality of sets of the test optical intensity data.

2. The system of claim 1, wherein the polarization direction monitor chooses one of the plurality of test areas providing the highest value among the plurality of sets of the test optical intensity data.

3. The system of claim 2, wherein the polarization direction monitor determines the polarization direction is orthogonal to a longer direction of one of the plurality of grating patterns corresponding to the chosen one of the plurality of test areas.

4. The system of claim 1, further comprising a polarization evaluator configured to evaluate a polarization state of the linearly polarized light based on the plurality of sets of the test optical intensity data.

5. A test mask for monitoring polarization comprising:
   a mask substrate exposed to light; and
   a plurality of grating patterns oriented in different directions on the mask substrate, each of the plurality of grating patterns having a space width preventing higher order diffracted lights including positive and negative first order diffracted lights from an image formation in an optical system of an exposure system,
   wherein the positive and negative first order diffracted lights do not penetrate a projection lens of the exposure system by the space width of each of the plurality of grating patterns; and
   wherein a plurality of light intensities of a plurality of projected images of the plurality of grating patterns are used to determine a polarization direction of the light.

6. The test mask of claim 5, further comprising a plurality of reference patterns disposed along the plurality of grating patterns, respectively.

7. A method for monitoring polarization including:
   projecting a plurality of grating patterns oriented in different directions onto a plurality of test areas by a linearly polarized light, respectively, each of the plurality of grating patterns having a space width preventing higher order diffracted lights from an image formation;
   collecting a plurality of sets of test optical intensity data on the plurality of test areas, respectively; and
   monitoring a polarization direction of the linearly polarized light by comparing the plurality of sets of the test optical intensity data.

8. The method of claim 7, wherein monitoring the polarization direction further includes choosing one of the plurality of test areas providing the highest value among the plurality of sets of the test optical intensity data.

9. The method of claim 8, wherein monitoring the polarization direction further includes determining the polarization direction is orthogonal to a longer direction of one of the plurality of grating patterns corresponding to the chosen one of the plurality of test areas.

10. The method of claim 7, wherein the plurality of test areas are defined on a resist layer.

11. The method of claim 10, wherein collecting the plurality of sets of test optical intensity data further includes developing the resist layer.

12. The method of claim 11, wherein collecting the plurality of sets of test optical intensity data further includes measuring thicknesses of portions of the developed resist layer on which the plurality of test areas are defined.

13. The method of claim 7, wherein projecting the plurality of grating patterns further includes projecting a plurality of reference patterns along the plurality of grating patterns onto a plurality of reference areas by the linearly polarized light, respectively.

14. The method of claim 13, wherein collecting the plurality of sets of test optical intensity data further includes measuring a plurality of line widths of the plurality of projected reference patterns, respectively.

15. The method of claim 7, further including:
   changing the linearly polarized light to a right hand circularly polarized light;
   projecting one of the plurality of grating patterns onto a first area by the right hand circularly polarized light; and
   collecting a first optical intensity datum on the first area.

16. The method of claim 15, further including:
   changing the linearly polarized light to a left hand circularly polarized light;
   projecting one of the plurality of grating patterns onto a second area by the left hand circularly polarized light; and
   collecting a second optical intensity datum on the second area.

17. The method of claim 16, further including evaluating a polarization state of the linearly polarized light, based on the plurality of sets of the optical intensity data on the plurality of test areas, the first optical intensity datum on the first area, and the second optical intensity datum on the second area.

18. The method of claim 17, wherein evaluating the polarization state further includes calculating stokes parameters by using the plurality of sets of the test optical intensity data on the plurality of test areas, the first optical intensity datum on the first area, and the second optical intensity datum on the second area.

* * * * *